(12) United States Patent
Lu et al.

(10) Patent No.: US 11,488,659 B2
(45) Date of Patent: Nov. 1, 2022

(54) MEMORY CIRCUIT AND WRITE METHOD

(71) Applicant: TAIWAN SEMICONDUCTOR MANUFACTURING COMPANY, LTD., Hsinchu (TW)

(72) Inventors: Shih-Lien-Linus Lu, Hsinchu (TW); Bo-Feng Young, Hsinchu (TW); Han-Jong Chia, Hsinchu (TW); Yu-Ming Lin, Hsinchu (TW); Sai-Hooi Yeong, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 85 days.

(21) Appl. No.: 17/069,312

(22) Filed: Oct. 13, 2020

(65) Prior Publication Data
US 2021/0375352 A1 Dec. 2, 2021

Related U.S. Application Data

(60) Provisional application No. 63/031,171, filed on May 28, 2020.

(51) Int. Cl.
*G11C 11/4094* (2006.01)
*G11C 11/408* (2006.01)
(Continued)

(52) U.S. Cl.
CPC .......... *G11C 11/4094* (2013.01); *G11C 5/025* (2013.01); *G11C 11/4074* (2013.01); *G11C 11/4085* (2013.01); *G11C 11/4099* (2013.01)

(58) Field of Classification Search
CPC . G11C 11/4094; G11C 5/025; G11C 11/4074; G11C 11/4085; G11C 11/4099; G11C 11/223; G11C 11/2275; G11C 7/22
See application file for complete search history.

(56) References Cited

U.S. PATENT DOCUMENTS 5,946,263 A 8/1999 Takahashi
6,930,940 B2 8/2005 Haraguchi
(Continued)

FOREIGN PATENT DOCUMENTS

TW I462095 11/2014

OTHER PUBLICATIONS

A. Biswas et al., "Conv-SRAM: An Energy-Efficient SRAM with In-Memory Dot-Product Computation for Low-Power Convolutional Neural Networks." IEEE Journal of Solid-State Circuits 54, 1 (Jan. 2019): 217-230 https://hdl.handle.net/1721.1/122468 (pp. 1-15).
(Continued)

*Primary Examiner* — Tri M Hoang
(74) *Attorney, Agent, or Firm* — Hauptman Ham, LLP

(57) ABSTRACT

A memory circuit includes a memory array and a control circuit. A first column of the memory array includes a select line, first and second bit lines, a first subset of memory cells coupled to the select line and the first bit line, and a second subset of memory cells coupled to the select line and the second bit line. The control circuit is configured to simultaneously activate each of the select line and the first bit line and, during a period in which the select line and first bit line are simultaneously activated, activate a first plurality of word lines, each word line of the first plurality of word lines being coupled to a memory cell of the first subset of memory cells.

20 Claims, 16 Drawing Sheets

(51) Int. Cl.
  *G11C 11/4099*  (2006.01)
  *G11C 11/4074*  (2006.01)
  *G11C 5/02*  (2006.01)

(56) References Cited

U.S. PATENT DOCUMENTS

| | | | |
|---|---|---|---|
| 8,213,216 B2 | 7/2012 | Wang et al. | |
| 8,238,153 B2* | 8/2012 | Lee | G11C 16/3427 |
| | | | 365/185.17 |
| 8,456,918 B2* | 6/2013 | Oh | G11C 16/0483 |
| | | | 365/185.23 |
| 9,378,826 B2* | 6/2016 | Lee | G11C 16/0483 |
| 9,424,914 B2 | 8/2016 | Shieh et al. | |
| 2008/0291732 A1 | 11/2008 | Jenne | |
| 2016/0141030 A1* | 5/2016 | Takeuchi | G11C 13/0007 |
| | | | 365/148 |
| 2020/0098414 A1* | 3/2020 | Vimercati | G11C 11/221 |
| 2020/0168276 A1* | 5/2020 | Yang | G11C 16/3427 |
| 2021/0111179 A1* | 4/2021 | Shivaraman | H01L 27/11507 |

OTHER PUBLICATIONS

Office Action dated Oct. 26, 2021 for corresponding case No. KR 10-2020-0171596 (pp. 1-4).
Office Action dated Apr. 14, 2022 for corresponding case No. TW 11120363200. (pp. 1-3).

* cited by examiner

| 0 | 0 | 0 | 0 | 1 | 1 | 1 | 1 |
|---|---|---|---|---|---|---|---|
| 1 | 1 | 1 | 1 | 0 | 0 | 0 | 0 |
| 1 | 1 | 1 | 1 | 0 | 0 | 0 | 0 |
| 0 | 0 | 0 | 0 |   |   |   |   |
| 1 | 1 | 1 | 1 | 0 | 0 | 0 | 0 |
| 0 | 0 | 0 | 0 |   |   |   |   |

| 0 | 0 | 0 | 0 | 1 | 1 | 1 | 1 |
|---|---|---|---|---|---|---|---|
| 1 | 1 | 1 | 1 | 0 | 0 | 0 | 0 |
| 1 | 1 | 1 | 1 | 0 | 0 | 0 | 0 |
| 0 | 0 | 0 | 0 | 1 | 1 | 1 | 1 |
| 1 | 1 | 1 | 1 | 0 | 0 | 0 | 0 |
| 0 | 0 | 0 | 0 | 1 | 1 | 1 | 1 |

MEMORY CIRCUIT AND WRITE METHOD

PRIORITY CLAIM

The present application claims the priority of U.S. Provisional Application No. 63/031,171, filed May 28, 2020, which is incorporated herein by reference in its entirety.

BACKGROUND

In some applications, integrated circuits (ICs) include memory circuits that store data in non-volatile memory (NVM) in which data are not lost when the IC is powered off. Types of NVM cells include three-terminal devices, in which a dielectric layer between a gate and each of two source/drain (S/D) terminals has one or more properties capable of being altered in response to applied voltages such that detectable property variations are used to represent stored logical states. In some cases, the dielectric layer includes a ferroelectric material and the device is referred to as a ferroelectric random-access memory (FRAM or FeRAM) cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-6E are diagrams of a memory array, in accordance with some embodiments.

FIGS. 7A-7H are diagrams of a memory array, in accordance with some embodiments.

FIGS. 8A and 8B are diagrams of a memory array, in accordance with some embodiments.

DETAILED DESCRIPTION

Figure 1A:
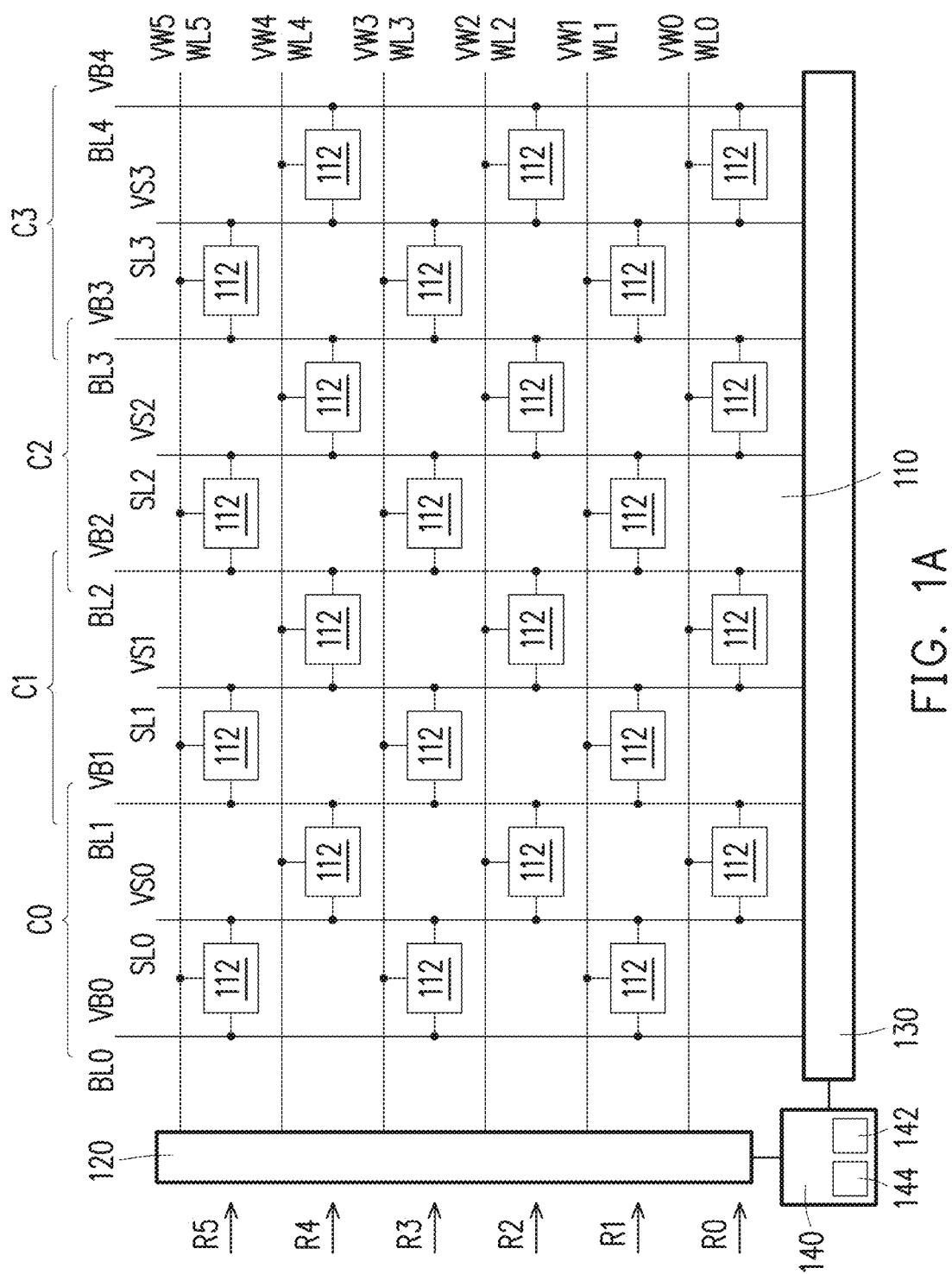
FIGS. 1A-1D are diagrams of a memory circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a memory circuit including three-terminal memory cells is capable of writing data to multiple cells in a single column simultaneously, thereby enabling column write schemes and algorithms in which data are written to multiple rows and columns at the same time. Compared to approaches in which data are not written to multiple cells in a single column simultaneously, such memory circuits are capable of having increased write bandwidth such that overall write times are lowered without exacerbating write disturb events.

Figure 1B:
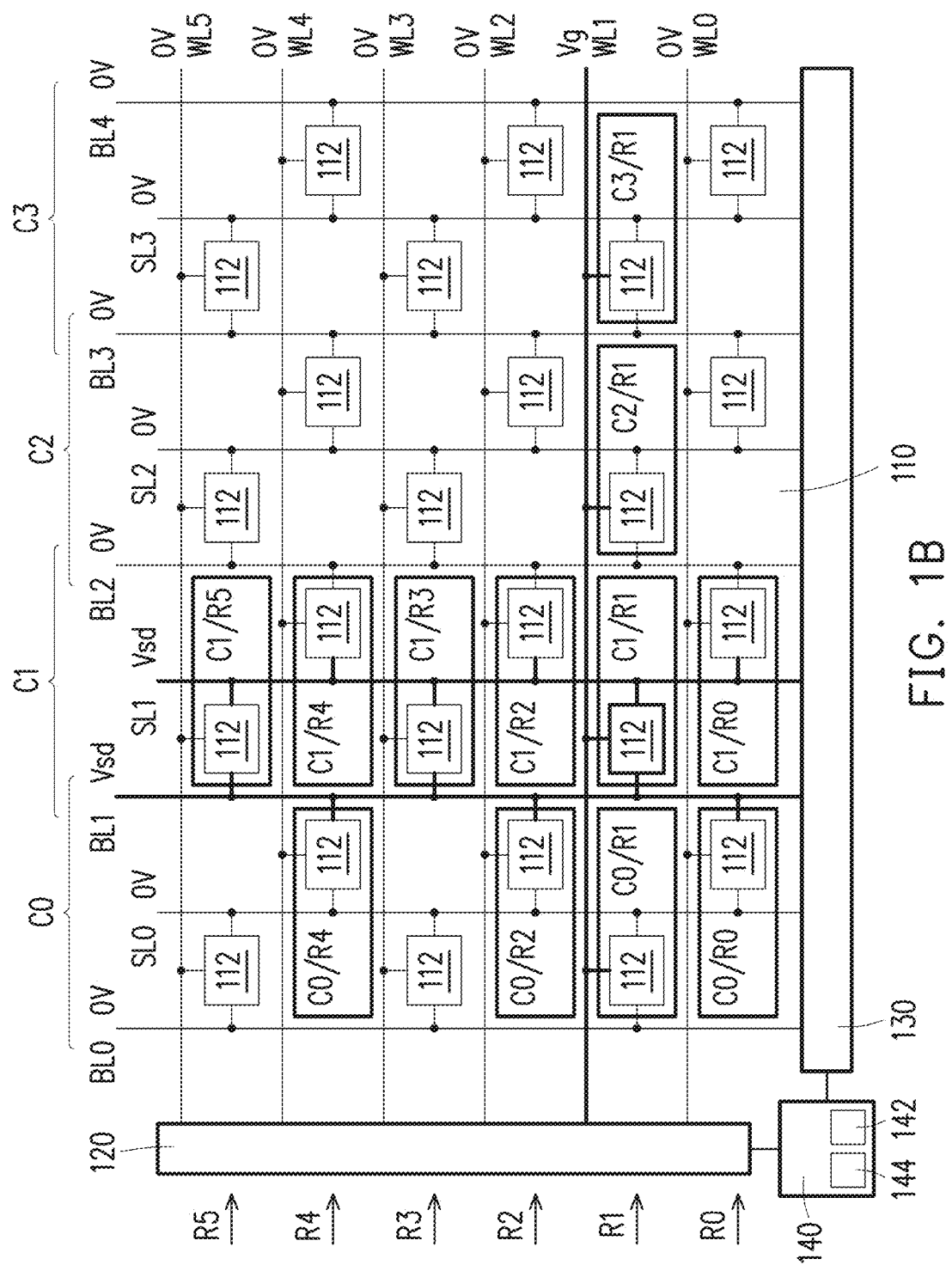
Figure 1C:
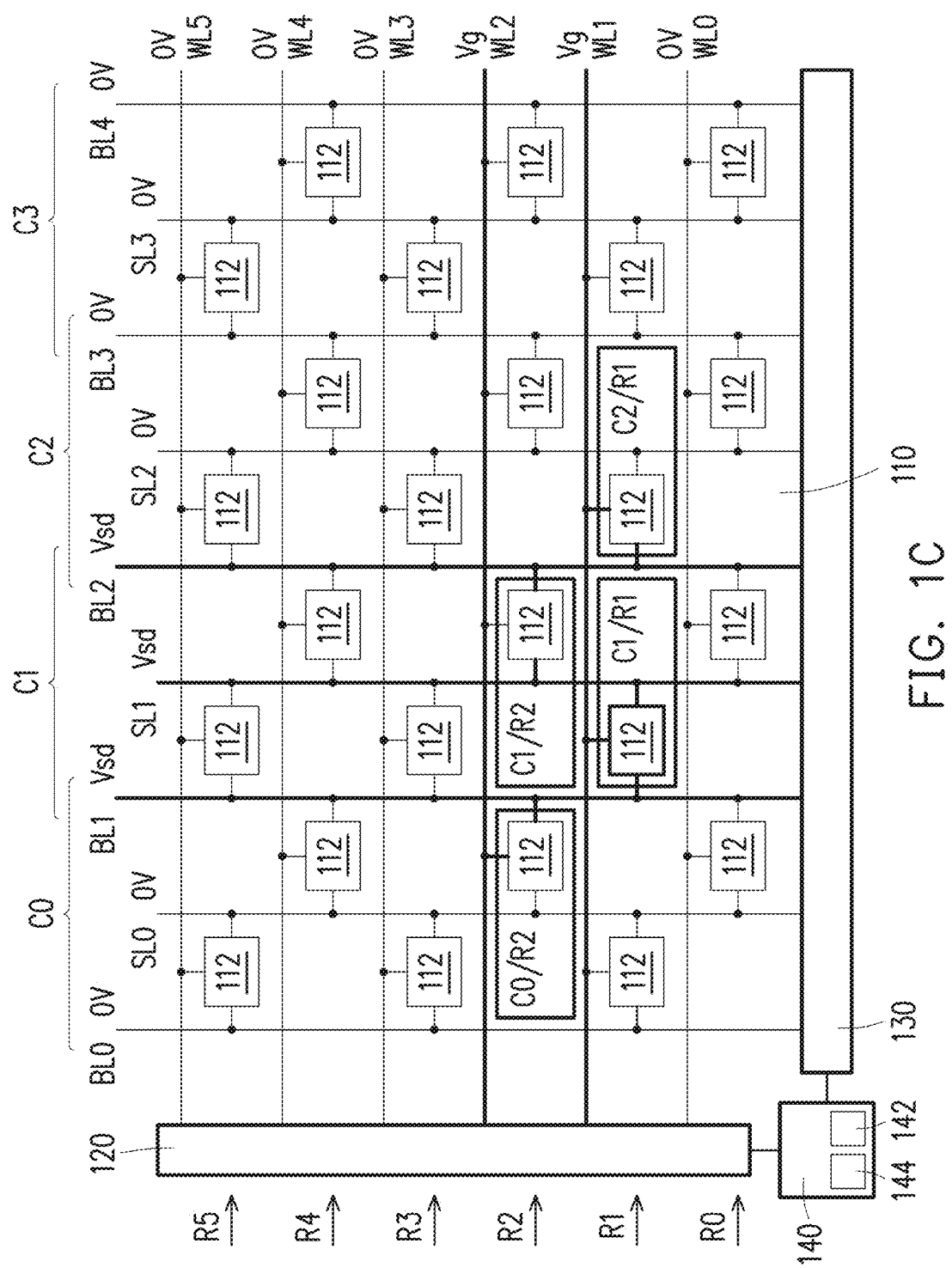
Figure 1D:
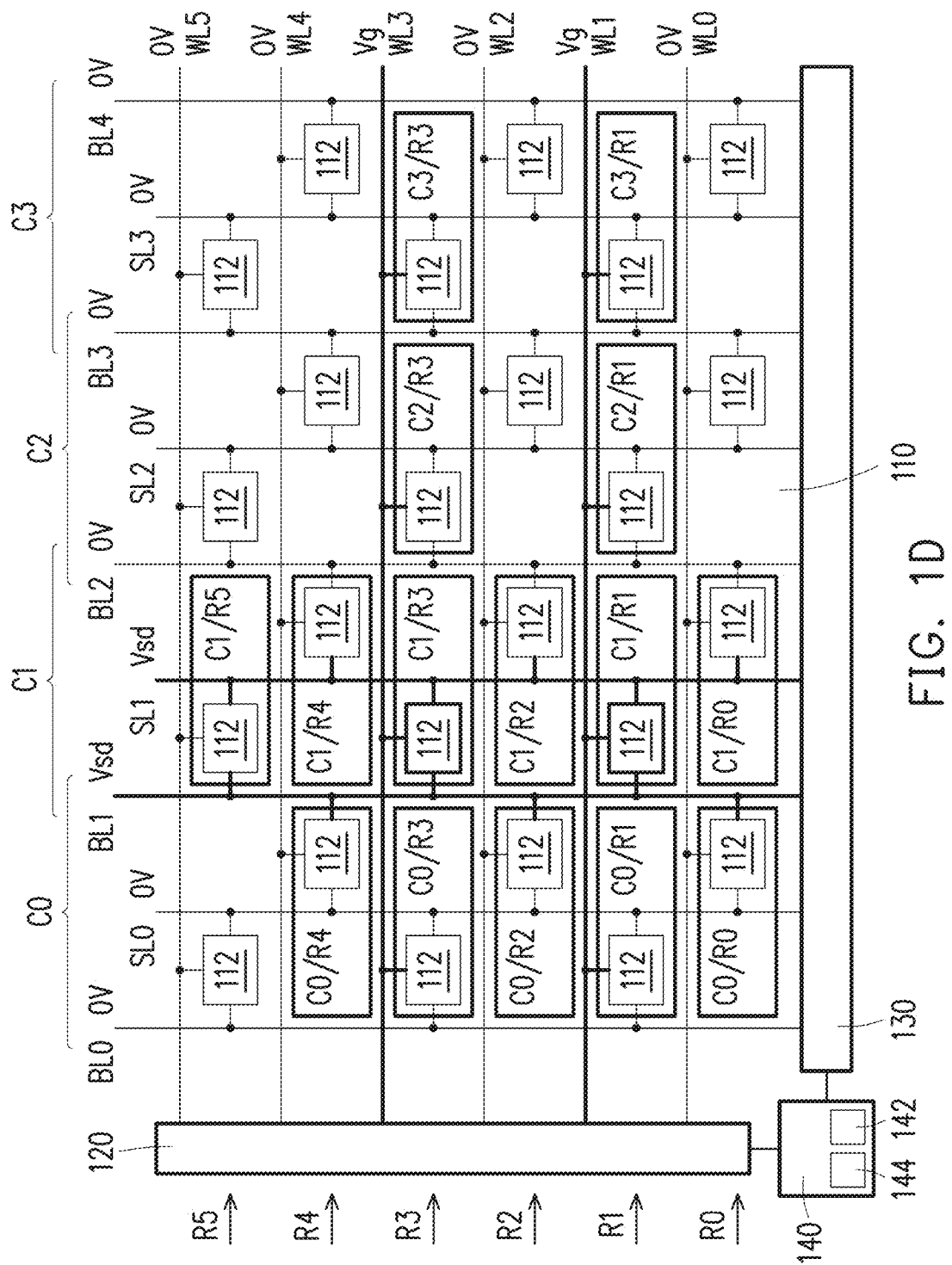

FIGS. 1A-1D are diagrams of a memory circuit 100, in accordance with some embodiments. FIG. 1A depicts memory circuit 100 generally, and each of FIGS. 1B-1D depicts a non-limiting example of a programming operation on memory circuit 100.

Memory circuit 100 includes a memory array 110 coupled to a word line driver 120 and a read/write interface 130, and a control circuit 140 coupled to word line driver 120 and read/write interface 130. Memory circuit 100 is configured to be capable of executing some or all of a method, e.g., one or more of methods 300, 400, or 500 discussed below with respect to FIGS. 3-5, in which data are written to multiple cells in a single column simultaneously, as discussed below.

Memory circuit 100 is simplified for the purpose of illustration. In various embodiments, memory circuit 100 includes various elements in addition to those depicted in FIGS. 1A-1D or is otherwise arranged so as to perform the operations discussed below.

Two or more circuit elements are considered to be coupled based on one or more direct signal connections and/or one or more indirect signal connections that include one or more logic devices, e.g., an inverter or logic gate, between the two or more circuit elements. In some embodiments, signal communications between the two or more coupled circuit elements are capable of being modified, e.g., inverted or made conditional, by the one or more logic devices.

Memory array 110 includes memory cells 112 arranged in columns C0-C3 and rows R0-R5. Memory cells 112 are depicted schematically in FIGS. 1A-1D for the purpose of illustration such that two subsets of the memory cells of each of columns C0-C3 are separately aligned vertically. In various embodiments, some or all of the memory cells 112 of columns C0-C3 are physically arranged in a line extending in a first direction, i.e., vertically or horizontally, and some or all of the memory cells 112 of rows R0-R5 are physically arranged in a line extending in a second direction, i.e., horizontally or vertically.

The numbers of rows and columns of memory cells 112 depicted in FIGS. 1A-1D are non-limiting examples used for illustration. In various embodiments, memory array 110 includes more than six rows R0-R5 and/or more than four columns C0-C3. In some embodiments, memory array 110 includes the number of rows ranging from 64 to 1024. In some embodiments, memory array 110 includes the number of rows ranging from 128 to 512. In some embodiments, memory array 110 includes the number of columns ranging from eight to 256. In some embodiments, memory array 110 includes the number of columns ranging from 36 to 96.

In the embodiment depicted in FIGS. 1A-1D, memory array 110 includes rows R0-R5 and columns C0-C3 arranged along respective row and column dimensions (not labeled). In some embodiments, memory array 110 has a three-dimensional (3D) arrangement, also referred to as a stacked arrangement, that includes one or more array layers (not shown) arranged perpendicularly to the row and column dimensions of the single layer depicted in FIGS. 1A-1D such that memory array 110 includes rows and columns in addition to those depicted in FIGS. 1A-1D.

Figure 2:
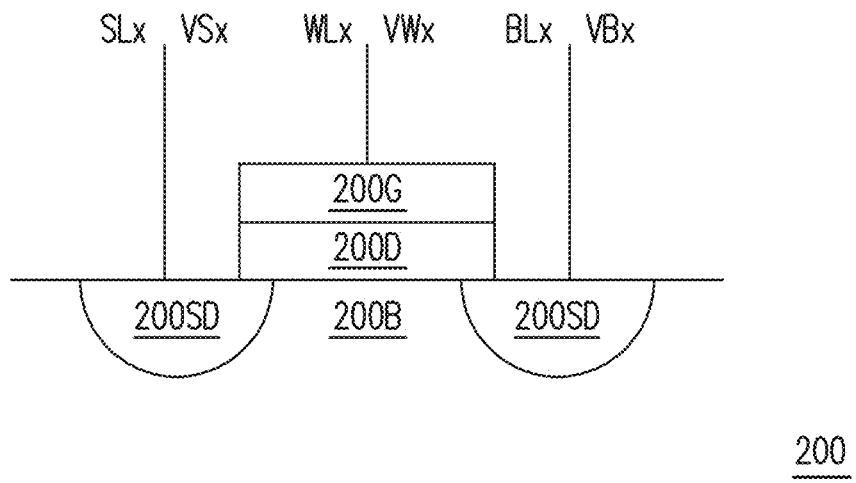
FIG. 2 is a diagram of a memory cell, in accordance with some embodiments.

A memory cell 112 is a three-terminal device including one or more dielectric layers between a gate and each of two S/D terminals (non-limiting examples depicted in FIG. 2). The one or more dielectric layers include one or more dielectric materials, e.g., a ferroelectric material, having properties controllable responsive to applied voltages such that varying property states are usable as representations of stored logic levels, i.e., logic high and logic low levels, as discussed below. In some embodiments, a memory cell 112 is an NVM cell, e.g., an FRAM cell. In some embodiments, a memory cell 112 includes a memory cell 200 discussed below with respect to FIG. 2.

In programming operations, a given memory cell 112 is configured to be programmed to a predictable state in response to receiving a first voltage at the gate and a second voltage at both S/D terminals, and to remain in the predictable state in response to receiving a reference, or ground, voltage at the gate and both S/D terminals. In the discussion below, the given memory cell 112 is described as being fully selected in the first scenario and unselected in the second scenario. Based on the three-terminal arrangement and memory array 110 configuration discussed below, the given memory cell 112 is capable of receiving various combinations of the first, second, and reference voltages other than those of the first and second scenarios, e.g., in response to programming activity on other memory cells 112. In the discussion below, the given memory cell 112 is described as being partially selected by receiving one of the combinations other than those of the first and second scenarios.

The given memory cell 112 is capable of remaining in the predictable state in response to some partial selection scenarios and being placed in an unpredictable state in response to other partial selection scenarios. As discussed below, by controlling write operations so as to avoid the partial selection scenarios that place memory cells 112 in unpredictable states, multiple memory cells 112 in a single column are capable of being programmed simultaneously, thereby improving write operation efficiency compared to approaches in which data are not written to multiple cells in a single column simultaneously.

Each memory cell 112 of a row R0-R5 includes the gate coupled to a corresponding word line WL0-WL5 configured to carry a respective word line voltage VW0-VW5, and each memory cell 112 of a column C0-C3 includes a S/D terminal coupled to a corresponding select line SL0-SL3 configured to carry a respective select line voltage VS0-VS3. Within each column C0-C3, memory cells 112 at alternating positions include S/D terminals coupled either to corresponding bit lines BL0-BL3 configured to carry respective bit line voltages VB0-VB3, or to corresponding bit lines BL1-BL4 configured to carry respective bit line voltages VB1-VB4. Each word line WL0-WL5 is coupled to word line driver 120, and each select line SL0-SL3 and bit line BL0-BL4 is coupled to read/write interface 130.

Each column C0-C3 thereby includes a first subset of memory cells 112 coupled to the corresponding select line SL0-SL3 and a first bit line of bit lines BL0-BL4, and a second subset of memory cells 112 coupled to the corresponding select line SL0-SL3 and a second bit line of bit lines BL0-BL4, each one of bit lines BL1-BL3 thereby being shared by a respective pair of adjacent columns C0/C1, C1/C2, or C2/C3.

In the embodiment depicted in FIGS. 1A-1D, the memory cells 112 at the alternating positions coupled to corresponding bit lines BL0-BL3 are further coupled to alternating ones of word lines WL0-WL5, i.e., word lines WL1, WL3, and WL5, and the memory cells 112 at the alternating positions coupled to corresponding bit lines BL1-BL4 are further coupled to alternating ones of word lines WL0-WL5, i.e., word lines WL0, WL2, and WL4. In a given one of columns C0-C3, the first subset of memory cells 112 are thereby coupled to the odd numbered word lines WL0-WL5, and the second subset of memory cells 112 are thereby coupled to the even numbered word lines WL0-WL5.

In some embodiments, memory circuit 100 includes an arrangement other than that depicted in FIGS. 1A-1D such that first and second subsets of memory cells 112 in a given one of columns C0-C3 are coupled to groupings of word lines other than the odd/even grouping of word lines WL0-WL5. In a non-limiting example, first and second subsets of memory cells 112 are coupled to corresponding first and second groups of word lines WL0-WL5, and each group includes adjacent pairs of word lines WL0-WL5 separated by adjacent pairs of word lines WL0-WL5 included in the other group such that each group includes both odd and even numbered word lines WL0-WL5.

In the embodiment depicted in FIGS. 1A-1D, the position of each of the 24 memory cells 112 corresponds to an intersection of one of the four columns C0-C3 and the six rows R0-R5 such that a given memory cell 112 is identifiable by its corresponding column and row, e.g., the rightmost and lowermost memory cell 112 corresponding to position C3/R0.

Word line driver 120 is an electronic circuit configured to generate word line voltages VW0-VW5 on respective word lines WL0-WL5 based on one or more control signals (not shown) received from control circuit 140 or from one or more circuits (not shown) external to memory circuit 100. Word line driver 120 is configured to drive each of word line voltages VW0-VW5, referred to generically as a word line voltage VWx, to either the reference voltage level, e.g., the ground voltage level, or to one or more other voltage levels so as to activate the corresponding word line WL0-WL5 during read and write operations. During a read or write operation, activating a given word line WL0-WL5 thereby causes one or more targeted memory cells 112 coupled to the given word line WL0-WL5 to be fully selected and other memory cells 112 coupled to the given word line WL0-WL5 to be partially selected, as further discussed below.

Read/write interface 130 is an electronic circuit configured to generate select line voltages VS0-VS3 on respective select lines SL0-SL3 and bit line voltages VB0-VB4 on respective bit lines BL0-BL4 based on one or more control signals (not shown) received from control circuit 140 or from one or more circuits (not shown) external to memory circuit 100. Read/write interface 130 is configured to drive each of select line voltages VS0-VS3, referred to generically as a select line voltage VSx, and each of bit line voltages VB0-VB4, referred to generically as a bit line voltage VBx, in the manner discussed above with respect to word line voltages VW0-VW5, so as to activate the corresponding select lines SL0-SL3 and bit lines BL0-BL4 during read and write operations. During a read or write operation, activating a given select line SL0-SL3 or bit line BL0-BL4 thereby causes one or more targeted memory cells 112 coupled to the given select line SL0-SL3 or bit line BL0-BL4 to be fully selected and other memory cells 112 coupled to the given select line SL0-SL3 or bit line BL0-BL4 to be partially selected, as further discussed below.

Read/write interface 130 is further configured to perform one or more additional read operations, e.g., measure one or more currents, voltages, or voltage differences, based on one or more signals received on one or a combination of select lines SL0-SL3 or bit lines BL0-BL4, in which a state of a selected memory cell 112 is detected, the state being indicative of the stored logic high level or logic low level.

Control circuit 140 is an electronic circuit configured to control operation of memory circuit 100 by generating the one or more control signals received by word line driver 120 and read/write interface 130 in accordance with the embodiments discussed below. In various embodiments, control circuit 140 includes a hardware processor 142 and a non-transitory, computer-readable storage medium 144. Storage medium 144, amongst other things, is encoded with, i.e., stores, computer program code, i.e., a set of executable instructions. Execution of the instructions by hardware processor 142 represents (at least in part) a memory circuit operation tool which implements a portion or all of, e.g., method 300 discussed below with respect to FIG. 3, method 400 discussed below with respect to FIG. 4, and/or method 500 discussed below with respect to FIG. 5 (hereinafter, the noted processes and/or methods).

Processor 142 is electrically coupled to computer-readable storage medium 144 and an I/O interface, and a network via a bus (details not shown). The network interface is connected to a network (not shown) so that processor 142 and computer-readable storage medium 144 are capable of connecting to external elements via the network. Processor 142 is configured to execute the computer program code encoded in computer-readable storage medium 144 in order to cause control circuit 140 and memory circuit 100 to be usable for performing a portion or all of the noted processes and/or methods. In one or more embodiments, processor 142 is a central processing unit (CPU), a multi-processor, a distributed processing system, an application specific integrated circuit (ASIC), and/or a suitable processing unit.

In one or more embodiments, computer-readable storage medium 144 is an electronic, magnetic, optical, electromagnetic, infrared, and/or a semiconductor system (or apparatus or device). For example, computer-readable storage medium 144 includes a semiconductor or solid-state memory, a magnetic tape, a removable computer diskette, a random access memory (RAM), a static RAM (SRAM), a dynamic RAM (DRAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, storage medium 144 stores the computer program code configured to cause control circuit 140 to generate the control signals so as to be usable for performing a portion or all of the noted processes and/or methods. In one or more embodiments, storage medium 144 also stores information which facilitates performing a portion or all of the noted processes and/or methods. In one or more embodiments, storage medium 144 stores one or more data sets, e.g., a plurality of data patterns, discussed below with respect to the noted processes and/or methods.

Each memory cell 112 is configured to be programmed in a first write operation to a first state corresponding to the logic high level in response to receiving word line voltage VWx having a first gate voltage level at the gate and receiving each of select line voltage VSx and bit line voltage VBx having a first S/D voltage level at the corresponding S/D terminal. The memory cell 112 is configured to be programmed in a second write operation to a second state corresponding to the logic low level in response to receiving word line voltage VWx having a second gate voltage level and receiving each of select line voltage VSx and bit line voltage VBx having a second S/D voltage level. In various embodiments, the first and second gate voltage levels have opposite polarities and/or the first and second S/D voltage levels have opposite polarities. In various embodiments, the first and second gate voltage levels have same magnitudes and/or the first and second S/D voltage levels have same magnitudes.

Each memory cell 112 is thereby configured to be programmed in the first and second write operations in response to being fully selected, i.e., receiving each of word line voltage VWx, select line voltage VSx, and bit line voltage VBx. The memory cell 112 is also configured so as to remain in a predictable state (not be programmed) in response to four non-programming partial selection combinations and to be placed in an unpredictable state in response to a fifth partial selection combination. As discussed below, in the various embodiments, write operations include each memory cell 112 either being fully selected or receiving one of the four non-programming partial selection combinations without receiving the fifth partial selection combination, thereby avoiding being placed in an unpredictable state.

As discussed below, each of the four non-programming combinations of word line voltage VWx, select line voltage VSx, and bit line voltage VBx and the fifth partial selection combination in which the given memory cell 112 is placed in an unpredictable state corresponds to a write disturb event in which one or more memory cells 112 other than the given memory cell 112 is programmed in the first or second write operation.

In the first non-programming combination, the given memory cell 112 receives word line voltage VWx having the first or second gate voltage level while receiving each of select line voltage VSx and bit line voltage VBx having the ground or reference voltage level at each of the S/D terminals. In the embodiment depicted in FIGS. 1A-1D, the first non-programming combination occurs when a memory cell 112 in the same row R0-R5 as that of the given memory cell 112 is fully selected in the first or second write operation.

As depicted in FIG. 1B, in a first non-limiting example, fully selecting memory cell 112 at position C1/R1 in the first or second write operation causes word line voltage VW1 on word line WL1 to have the first or second gate voltage level (represented collectively as Vg), select line voltages VSx other than select line voltage VS1 on select line SL1 to have the ground voltage level (represented as 0V), and bit line voltages VBx other than bit line voltage VB1 on bit line BL1 to have ground voltage level 0V, thereby causing each of memory cells 112 at positions C0/R1, C2/R1, and C3/R1 to receive the first non-programming combination.

In the second non-programming combination, the given memory cell 112 receives each of select line voltage VSx and bit line voltage VBx having the first or second S/D voltage level while receiving word line voltage VWx having the ground or reference voltage level at the gate. In the embodiment depicted in FIGS. 1A-1D, the second non-programming combination occurs when a memory cell 112 in the same column C0-C3 and subset of memory cells 112 in the column C0-C3 as that of the given memory cell 112 is fully selected in the first or second write operation.

In the first non-limiting example depicted in FIG. 1B, select line voltage VS1 on select line SL1 having the first or second S/D voltage level (represented collectively as Vsd), bit line voltage VB1 on bit line BL1 having the corresponding first or second S/D voltage level Vsd, and word line voltages VWx other than word line voltage VW1 on word line WL1 having ground voltage level 0V cause memory cells 112 at positions C1/R3 and C1/R5 to receive the second non-programming combination.

In the third non-programming combination, the given memory cell 112 receives select line voltage VSx having the first or second S/D voltage level while receiving each of bit line voltage VBx and word line voltage VWx having the ground or reference voltage level. In the embodiment depicted in FIGS. 1A-1D, the third non-programming combination occurs when a memory cell 112 in the same column C0-C3 and different subset of memory cells 112 in the column C0-C3 as that of the given memory cell 112 is fully selected in the first or second write operation.

In the first non-limiting example depicted in FIG. 1B, select line voltage VS1 on select line SL1 having first or second S/D voltage level Vsd, bit line voltages VBx other than bit line voltage VB1 on bit line BL1 having ground voltage level 0V, and word line voltages VWx other than word line voltage VW1 on word line WL1 having ground voltage level 0V cause memory cells 112 at positions C1/R0, C1/R2, and C1/R4 to receive the third non-programming combination.

In the fourth non-programming combination, the given memory cell 112 receives bit line voltage VBx having the first or second S/D voltage level while receiving select line voltage VSx and word line voltage VWx having the ground or reference voltage level. In the embodiment depicted in FIGS. 1A-1D, the fourth non-programming combination occurs when a memory cell 112 in a column C0-C3 adjacent to that of the given memory cell 112 and sharing a bit line BL1-BL3 with the given memory cell 112 is fully selected in the first or second write operation.

In the first non-limiting example depicted in FIG. 1B, bit line voltage VB1 on bit line BL1 having first or second S/D voltage level Vsd, select line voltages VSx other than select line voltage VS1 on select line SL1 having ground voltage level 0V, and word line voltages VWx other than word line voltage VW1 on word line WL1 having ground voltage level 0V cause memory cells 112 at positions C0/R0, C0/R2, and C0/R4 to receive the fourth non-programming combination.

In the fifth partial selection combination, the given memory cell 112 is capable of being placed in the unpredictable state in response to receiving the partial-programming combination of word line voltage VWx having the first or second gate voltage level and bit line voltage VBx having the corresponding one of the first or second S/D voltage levels while receiving select line voltage VSx having the ground or reference voltage level.

In the embodiment depicted in FIGS. 1A-1D, the fifth partial selection combination occurs when two or more memory cells 112 in a same column C0-C3 as that of the given memory cell 112 are simultaneously programmed by being fully selected in the first or second write operation, and the two or more memory cells 112 include at least one memory cell 112 in each of the first and second subsets of memory cells 112 in the same column C0-C3.

In a second non-limiting example depicted in FIG. 1C, simultaneously fully selecting each of memory cells 112 at positions C1/R1 and C1/R2 in the first or second write operation causes each of word line voltages VW1 on word line WL1 and VW2 on word line WL2 to have first or second gate voltage level Vg, each of bit line voltages VB1 on bit line BL1 and VB2 on bit line BL2 to have the corresponding first or second S/D voltage level Vsd, and select line voltages VSx other than select line voltage VS1 on select line SL1 to have ground voltage level 0V, thereby causing each of memory cells 112 at positions C0/R2 and C2/R1 to receive the fifth partial selection combination, thereby potentially placing each of memory cells 112 at positions C0/R2 and C2/R1 in an unpredictable state.

Memory circuit 100 is configured to be capable of simultaneously programming two or more memory cells 112 by executing the first and second write operations on the two or more memory cells 112 in a same column C0-C3, each of the two or more memory cells 112 being included in a same subset of memory cells 112 in the same column C0-C3. Because each of the two or more memory cells 112 is included in the same subset of memory cells 112, memory cells 112 other than the two or more memory cells 112 avoid receiving the fifth partial selection combination and are either partially selected by receiving one of the first through fourth non-programming combinations or unselected by receiving each of word line voltage VWx, select line voltage VSx, and bit line voltage VBx having the ground voltage level.

In a third non-limiting example depicted in FIG. 1D, simultaneously programming, by fully selecting, each of memory cells 112 at positions C1/R1 and C1/R3 in the first or second write operation causes each of word line voltages VW1 on word line WL1 and VW3 on word line WL3 to have first or second gate voltage level Vg, select line voltage VS1 on select line SL1 to have the corresponding first or second S/D voltage level, bit line voltage VB1 on bit line BL1 to have the corresponding first or second S/D voltage level Vsd, and each voltage other than word line voltages VW1 and VW3, select line voltage VS1, and bit line voltage VB1 to have the ground voltage level. Simultaneously programming each of memory cells 112 at positions C1/R1 C1/R3 in the first or second write operation thereby causes each of memory cells 112 at positions C0/R1, C2/R1, C3/R1, C0/R3, C2/R3, and C3/R3 to receive the first non-programming combination, memory cell 112 at position C1/R5 to receive the second non-programming combination, each of memory cells 112 at positions C1/R0, C1/R2, and C1/R4 to receive the third non-programming combination, and each of memory cells 112 at positions C0/R0, C0/R2, and C0/R4 to receive the fourth non-programming combination. All other memory cells 112 in memory array 110 thereby receive each of word line voltage VWx, select line voltage VSx, and bit line voltage VBx having ground voltage level 0V.

Figure 1E:
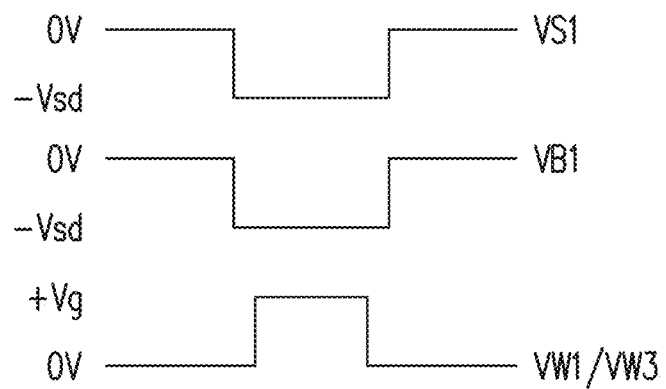
FIGS. 1E and 1F are diagrams of memory circuit operating parameters, in accordance with some embodiments.
Figure 1F:
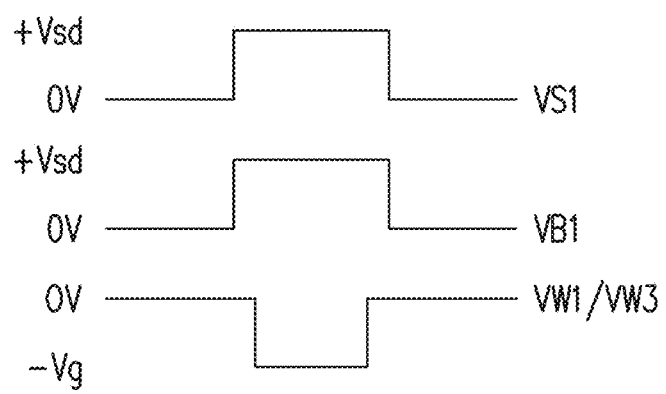

FIGS. 1E and 1F are diagrams of memory circuit operating parameters, in accordance with some embodiments corresponding to the third non-limiting example of memory circuit 100 operation depicted in FIG. 1D. FIG. 1E is a timing diagram corresponding to the first write operation in which the memory cells 112 at positions C1/R1 and C1/R3 are simultaneously programmed to the first state corresponding to the logic high level, and FIG. 1F is a timing diagram corresponding to the second write operation in which the memory cells 112 at positions C1/R1 and C1/R3 are simultaneously programmed to the second state corresponding to the logic low level.

As depicted in FIG. 1E, the first write operation includes each of select line voltage VS1 and bit line voltage VB1 transitioning from ground voltage level 0V to the first S/D voltage level equal to −Vsd for a first period (not labeled), followed by each of select line voltage VS1 and bit line voltage VB1 transitioning from first S/D voltage level −Vsd to ground voltage level 0V. During the first period in which each of select line voltage VS1 and bit line voltage VB1 has first S/D voltage level −Vsd, each of word line voltages VW1 and VW3 transitions from ground voltage level 0V to the first gate voltage level equal to +Vg for a second period (not labeled), followed by each of word line voltages VW1 and VW3 transitioning from first gate voltage level +Vg to ground voltage level 0V.

As depicted in FIG. 1F, the second write operation includes each of select line voltage VS1 and bit line voltage VB1 transitioning from ground voltage level 0V to the second S/D voltage level equal to +Vsd for a third period (not labeled), followed by each of select line voltage VS1 and bit line voltage VB1 transitioning from second S/D voltage level +Vsd to ground voltage level 0V. During the third period in which each of select line voltage VS1 and bit line voltage VB1 has second S/D voltage level +Vsd, each of word line voltages VW1 and VW3 transitions from ground voltage level 0V to the second gate voltage level equal to −Vg for a fourth period (not labeled), followed by each of word line voltages VW1 and VW3 transitioning from second gate voltage level −Vg to ground voltage level 0V.

The voltage levels and timing relationships depicted in FIGS. 1E and 1F are non-limiting examples provided for the purpose of illustration. In various embodiments, one or more of first or second S/D voltages −Vsd or +Vsd, first or second gate voltage levels +Vg or −Vg, or ground voltage level 0V have relative values other than those depicted in FIGS. 1E and 1F. In various embodiments, one or more of the first through fourth periods have durations relative to the other(s) of first through fourth periods other than those depicted in FIGS. 1E and 1F.

The operations depicted in FIGS. 1B-1F are non-limiting examples provided for the purpose of illustration. In various embodiments, programming operations include programming one or more memory cells 112 in addition to those included in FIGS. 1B-1E, in accordance with the various embodiments discussed below.

As illustrated in FIGS. 1B-1F, by being configured to simultaneously program multiple cells in a single column in first and second write operations, memory circuit 100 enables column write schemes, e.g., in accordance with one or both of methods 300 or 400 discussed below, and algorithms, e.g., in accordance with method 500 discussed below, in which data are written to multiple rows and columns at the same time. Compared to approaches in which data are not written to multiple cells in a single column simultaneously, such memory circuits are capable of having increased write bandwidth such that overall write times are lowered without exacerbating write disturb events.

FIG. 2 is a diagram of memory cell 200, in accordance with some embodiments. Memory cell 200, also referred to as NVM cell 200 or FRAM cell 200 in some embodiments, is usable as one or more instances of memory cell 112 discussed above with respect to FIGS. 1A-1F. Memory cell 200 includes a substrate 200B, S/D structures 200SD positioned in substrate 200B, a dielectric layer 200D overlying substrate 200B, and a gate electrode 200G overlying dielectric layer 200D and substrate 200B.

Gate electrode 200G corresponds to the gate of memory cell 112, is coupled to word line WLx, and is thereby configured to receive word line voltage VWx; a first S/D structure 200SD corresponds to the first S/D terminal of memory cell 112, is coupled to select line SLx, and is thereby configured to receive select line voltage VSx; and a second S/D structure 200SD corresponds to the second S/D terminal of memory cell 112, is coupled to bit line BLx, and is thereby configured to receive bit line voltage VBx, each discussed above with respect to FIGS. 1A-1F.

Dielectric layer 200D includes one or more dielectric materials configured to electrically isolate gate electrode 200G from substrate 200B and S/D structures 200SD. The one or more dielectric materials include at least one ferroelectric material, e.g., lead zirconate titanate (PZT), capable of being altered responsive to word line voltage VWx received at gate electrode 200G, select line voltage VSx received at the first S/D structure 200SD, and bit line voltage VBx received at the second S/D structure 200SD. In some embodiments, the at least one ferroelectric material is capable of being altered based on dipoles being aligned responsive to the received voltages such that a first dipole alignment corresponds to memory cell 200 being programmed to the logic high level and a second dipole alignment corresponds to memory cell 200 being programmed to the logic low level.

By including memory cell 200 as one or more instances of memory cell 112, memory circuit 100 is capable of realizing the benefits discussed above.

Figure 3:
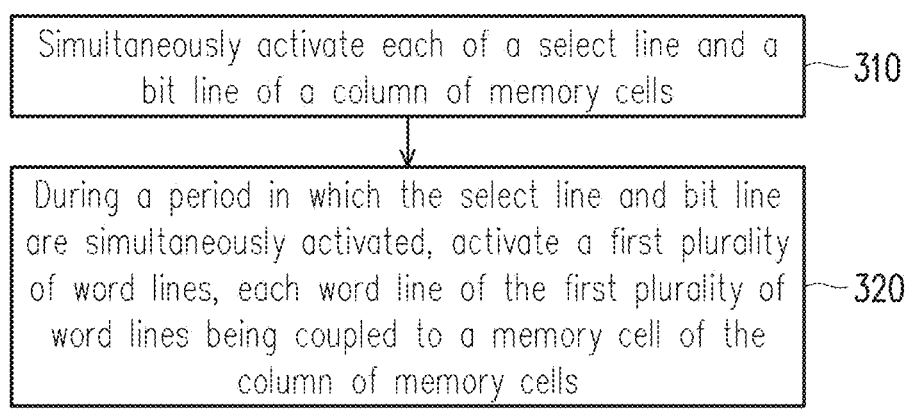
FIG. 3 is a flowchart of a method of writing data to a memory array, in accordance with some embodiments.

FIG. 3 is a flowchart of method 300 of writing data to a memory array, in accordance with some embodiments. Method 300 is usable with a memory circuit, e.g., memory circuit 100 discussed above with respect to FIGS. 1A-1F.

The sequence in which the operations of method 300 are depicted in FIG. 3 is for illustration only; the operations of method 300 are capable of being executed simultaneously or in sequences that differ from that depicted in FIG. 3. In some embodiments, operations in addition to those depicted in FIG. 3 are performed before, between, during, and/or after the operations depicted in FIG. 3. In some embodiments, the operations of method 300 are a subset of a method of operating an IC, e.g., a processor, logic, memory, or signal processing circuit, or the like. In various embodiments, one or more operations of method 300 are a subset of method 400 or 500 discussed below with respect to FIGS. 4 and 5.

At operation 310, each of a select line and a bit line of a column of memory cells is simultaneously activated. The column of memory cells includes a select line and first and second bit lines, and simultaneously activating each of the select line and the bit line includes activating each of the select line and the first bit line coupled to a first subset of the memory cells, a second subset of the memory cells being coupled to the select line and the second bit line.

In some embodiments, one of the first or second subsets of memory cells are positioned in even numbered rows of memory cells of the memory array, and the other of the first or second subsets of memory cells are positioned in odd numbered rows of memory cells of the memory array.

In some embodiments, simultaneously activating each of the select line and the bit line of the column of memory cells includes simultaneously activating a select line SL0-SL4 and a corresponding one of bit lines BL0-BL3 or BL1-BL4 of a corresponding column C0-C3 of memory array 110 discussed above with respect to memory circuit 100 and FIGS. 1A-1F.

Simultaneously activating each of the select line and the bit line of the column of memory cells includes the memory cells being three-terminal memory cells, e.g., memory cells 112 discussed above with respect to FIGS. 1A-1F. In some embodiments, the memory cells are NVM cells, e.g., FRAM cells. In some embodiments, the memory cells are memory cells 200 discussed above with respect to FIG. 2.

In some embodiments, simultaneously activating each of the select line and the bit line comprises driving each of the select line and the bit line to an S/D voltage level having a first polarity. In some embodiments, simultaneously activating each of the select line and the bit line comprises driving the second bit line to a reference voltage level, e.g., a ground voltage level.

In various embodiments, simultaneously activating each of the select line and the bit line is part of programming the first subset of memory cells to a logic high level in a first write operation, or part of programming the first subset of memory cells to a logic low level in a second write operation.

In some embodiments, the column is a first column of a plurality of columns of memory cells, and simultaneously activating each of the select line and the bit line of the column of memory cells includes simultaneously activating select lines and bit lines of multiple columns of the plurality of columns.

At operation 320, during a period in which the select line and bit line are simultaneously activated, a first plurality of word lines is activated, each word line of the first plurality of word lines being coupled to a memory cell of the column of memory cells. Activating the first plurality of word lines includes activating the first plurality of word lines coupled to the first subset of memory cells, a second plurality of word lines being coupled to the second subset of memory cells.

In various embodiments, activating the first plurality of word lines includes activating the first plurality of word lines corresponding to either some or all of odd numbered rows of the first column of memory cells or some or all of even numbered rows of the first column of memory cells.

In some embodiments, activating the first plurality of word lines includes activating two or more of word lines WL0-WL5 discussed above with respect to memory circuit 100 and FIGS. 1A-1F.

In some embodiments, activating the first plurality of word lines includes driving each word line of the first plurality of word lines to a gate voltage level having a second polarity opposite the first polarity. In some embodiments, activating the first plurality of word lines includes driving each word line of the first plurality of word lines to the gate voltage level having a same magnitude as the S/D voltage level.

In some embodiments, activating the plurality of word lines includes driving each word line of the second plurality of word lines to the reference voltage level.

In various embodiments, activating the first plurality of word lines is part of programming the first subset of memory cells to the logic high level in the first write operation, or part of programming the first subset of memory cells to the logic low level in the second write operation.

In some embodiments, the column is a first column of a plurality of columns of memory cells, and activating the first plurality of word lines includes each word line of the first plurality of word lines being coupled to a memory cell of each column of the plurality of columns.

By executing some or all of the operations of method 300, multiple cells in a single column are simultaneously programmed in write operations, thereby realizing the benefits discussed above with respect to memory circuit 100.

Figure 4:
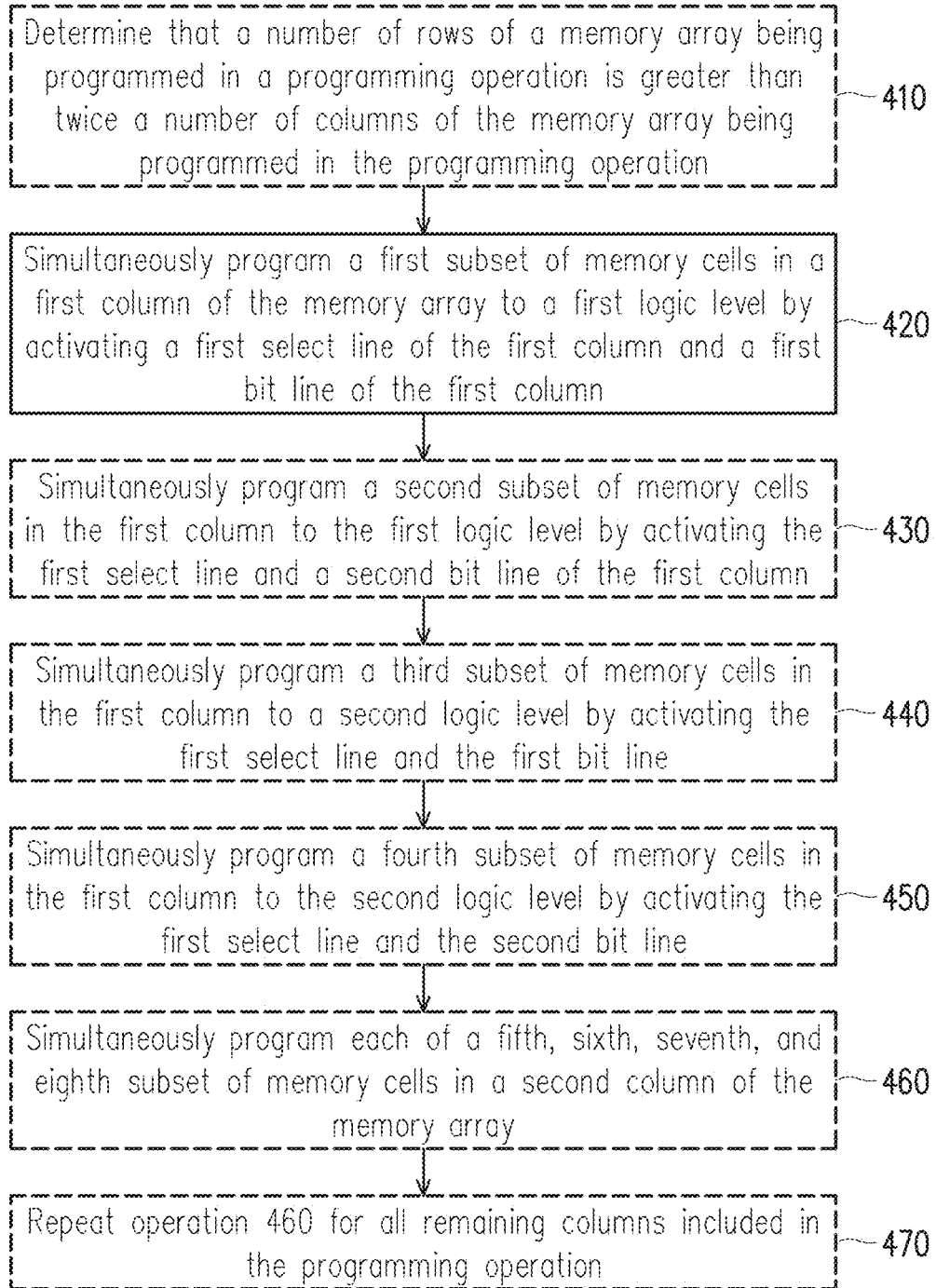
FIG. 4 is a flowchart of a method of writing data to a memory array, in accordance with some embodiments.

FIG. 4 is a flowchart of a method 400 of writing data to a memory array, in accordance with some embodiments. Method 400 is usable with a memory circuit, e.g., memory circuit 100 discussed above with respect to FIGS. 1A-1F.

The sequence in which the operations of method 400 are depicted in FIG. 4 is for illustration only; the operations of method 400 are capable of being executed in sequences that differ from that depicted in FIG. 4. In some embodiments, operations in addition to those depicted in FIG. 4 are performed before, between, during, and/or after the operations depicted in FIG. 4. In some embodiments, the operations of method 400 are a subset of a method of operating an IC, e.g., a processor, logic, memory, or signal processing circuit, or the like. In some embodiments, the operations of method 500 are a subset of a method of performing a memory array test.

In accordance with various embodiments, the memory array includes rows and columns of memory cells, and writing data to the memory array is capable of being performed by programming memory cells by row or by column. Programming a given row includes sequentially performing the first and second write operations once each so as to program a total of two subsets of memory cells to either the high or low logic level. Programming a given column includes sequentially performing the first and second write operations twice each, once on each of two subsets as discussed above with respect to FIGS. 1A-3, so as to program a total of four subsets of memory cells to either the high or low logic level. Accordingly, in cases in which a number of rows being programmed in a programming operation is greater than twice a number of columns being programmed in the programming operation, programming the memory cells by column requires performing fewer write operations than are required to program the memory cells by row. In such cases, programming the memory cells by column is thereby more efficient than programming by row.

At operation 410, in some embodiments, a number of rows of a memory array being programmed in a programming operation is determined to be greater than twice a number of columns of the memory array being programmed in the programming operation. In some embodiments, the programming operation includes an entirety of the memory array, and determining that the number of rows is greater than twice the number of columns includes determining that a total number of rows in the memory array is greater than twice a total number of columns in the memory array. In some embodiments, determining that the number of rows is greater than twice the number of columns is part of configuring a memory circuit, e.g., memory circuit 100 discussed above with respect to FIGS. 1A-1F.

In some embodiments, the programming operation includes a portion of the memory array, e.g., a partial write operation, and determining that the number of rows is greater than twice the number of columns includes determining that a subset of the total number of rows in the memory array is greater than twice a subset of the total number of columns in the memory array.

In some embodiments, determining that the number of rows is greater than twice the number of columns includes determining that a subset or total number of rows R0-R5 is greater than twice a subset or total number of columns C0-C3, discussed above with respect to memory circuit 100 and FIGS. 1A-1F.

At operation 420, a first subset of memory cells in a first column of the memory array are simultaneously programmed to a first logic level by activating a first select line of the first column and a first bit line of the first column. Simultaneously programming the first subset of memory cells in the first column of the memory array includes executing operations 310 and 320 of method 300 discussed above with respect to FIG. 3.

In various embodiments, programming a memory cell, e.g., the first subset of memory cells, to the first logic level includes the first logic level being the logic high level and a second logic level being the logic low level, or includes the first logic level being the logic low level and the second logic level being the logic high level.

In some embodiments, activating the first select line of the first column and the first bit line of the first column includes simultaneously activating a select line SL0-SL4 and a corresponding one of bit lines BL0-BL3 or BL1-BL4 of a corresponding column C0-C3 of memory array 110 discussed above with respect to memory circuit 100 and FIGS. 1A-1F.

In some embodiments, simultaneously programming the first subset of memory cells to the first logic level by activating the first select line and the first bit line includes driving the first select line and the first bit line to a first S/D voltage level having a first polarity. In some embodiments, simultaneously programming the first subset of memory cells to the first logic level includes driving a first subset of word lines to a first gate voltage level having a second polarity.

At operation 430, in some embodiments, a second subset of memory cells in the first column are simultaneously programmed to the first logic level by activating the first select line and a second bit line of the first column. Simultaneously programming the second subset of memory cells in the first column of the memory array includes executing operations 310 and 320 of method 300 discussed above with respect to FIG. 3.

In some embodiments, activating the first select line of the first column and the second bit line of the first column includes simultaneously activating a select line SL0-SL4 and a corresponding one of bit lines BL0-BL3 or BL1-BL4 of a corresponding column C0-C3 of memory array 110 discussed above with respect to memory circuit 100 and FIGS. 1A-1F.

In some embodiments, simultaneously programming the second subset of memory cells to the first logic level by activating the first select line and the second bit line includes driving the first select line and the second bit line to the first S/D voltage level having the first polarity. In some embodiments, simultaneously programming the second subset of memory cells to the first logic level includes driving a second subset of word lines to the first gate voltage level having the second polarity.

At operation 440, in some embodiments, a third subset of memory cells in the first column are simultaneously programmed to the second logic level by activating the first select line and the first bit line. Simultaneously programming the third subset of memory cells in the first column of the memory array includes executing operations 310 and 320 of method 300 discussed above with respect to FIG. 3.

In some embodiments, activating the first select line of the first column and the first bit line of the first column includes simultaneously activating a select line SL0-SL4 and a corresponding one of bit lines BL0-BL3 or BL1-BL4 of a corresponding column C0-C3 of memory array 110 discussed above with respect to memory circuit 100 and FIGS. 1A-1F.

In some embodiments, simultaneously programming the third subset of memory cells to the second logic level by activating the first select line and the first bit line includes driving the first select line and the first bit line to a second S/D voltage level having the second polarity. In some embodiments, simultaneously programming the third subset of memory cells to the second logic level includes driving a third subset of word lines to a second gate voltage level having the first polarity.

At operation 450, in some embodiments, a fourth subset of memory cells in the first column are simultaneously programmed to the second logic level by activating the first select line and the second bit line. Simultaneously programming the fourth subset of memory cells in the first column of the memory array includes executing operations 310 and 320 of method 300 discussed above with respect to FIG. 3.

In some embodiments, activating the first select line of the first column and the second bit line of the first column includes simultaneously activating a select line SL0-SL4 and a corresponding one of bit lines BL0-BL3 or BL1-BL4 of a corresponding column C0-C3 of memory array 110 discussed above with respect to memory circuit 100 and FIGS. 1A-1F.

In some embodiments, simultaneously programming the fourth subset of memory cells to the second logic level by activating the first select line and the second bit line includes driving the first select line and the second bit line to the second S/D voltage level having the second polarity. In some embodiments, simultaneously programming the fourth subset of memory cells to the second logic level includes driving a fourth subset of word lines to the second gate voltage level having the first polarity.

Operations 420-450 are executed sequentially, in any order, thereby programming each memory cell in the first column to one of the logic high or low levels in some embodiments, or thereby programming a portion of the memory cells in the first column to one of the logic high or low levels, the portion corresponding to the programming operation, in some embodiments.

At operation 460, in some embodiments, each of a fifth, sixth, seventh, and eighth subset of memory cells in a second column of the memory array is simultaneously programmed. Simultaneously programming each of the fifth, sixth, seventh, and eighth subsets of memory cells in the second column of the memory array includes simultaneously programming a fifth subset of memory cells in a second column of the memory array to the first logic level by activating a second select line of the second column and a third bit line of the second column, simultaneously programming a sixth subset of memory cells in the second column to the first logic level by activating the second select line and a fourth bit line of the second column, simultaneously programming a seventh subset of memory cells in the second column to the second logic level by activating the second select line and the third bit line, and simultaneously programming an eighth subset of memory cells in the second column to the second logic level by activating the second select line and the fourth bit line.

Each of the simultaneously programming the fifth through eight subsets of memory cells in the second column of the memory array includes executing operations 310 and 320 of method 300 discussed above with respect to FIG. 3 such that the memory cells of the second column of the memory array are programmed in the manner discussed above with respect to operations 420-450.

At operation 470, in some embodiments, operation 460 is repeated for all columns of the memory array included in the programming operation. By repeating operation 460 for all of the columns, each memory cell in the memory array included in the programming operation, i.e., a portion or all of the memory cells in the memory array, is programed to one of the logic high or low levels.

In some embodiments, the memory array includes a plurality of layers of columns and rows, and repeating operation 460 includes repeating operation 460 on each layer of the plurality of layers included in the programming operation.

By executing some or all of the operations of method 400, multiple cells in a portion or all of the columns of a memory array are simultaneously programmed in first and second write operations, thereby realizing the benefits discussed above with respect to memory circuit 100. In cases in which the number of rows in the memory array being programmed in a programming operation is greater than twice the number of columns being programmed in the programming operation, execution of method 400 results in fewer programming operations than approaches in which multiple cells in a column are not simultaneously programmed, thereby decreasing overall programming time.

Figure 5:
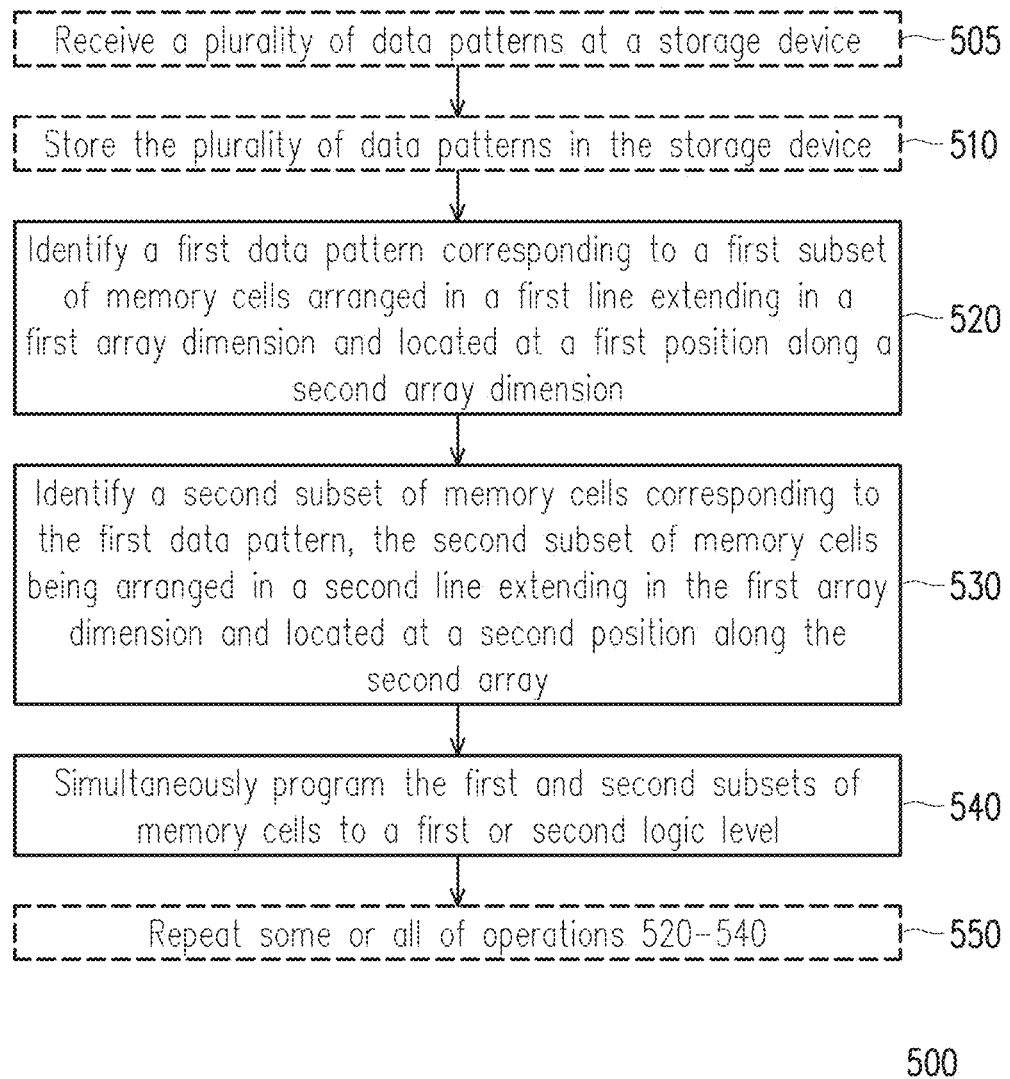
FIG. 5 is a flowchart of a method of writing data to a memory array, in accordance with some embodiments.

FIG. 5 is a flowchart of method 500 of writing data to a memory array, in accordance with some embodiments. Method 500 is usable with a memory circuit, e.g., memory circuit 100 discussed above with respect to FIGS. 1A-1F.

The sequence in which the operations of method 500 are depicted in FIG. 5 is for illustration only; the operations of method 500 are capable of being executed simultaneously or in sequences that differ from that depicted in FIG. 5. In some embodiments, operations in addition to those depicted in FIG. 5 are performed before, between, during, and/or after the operations depicted in FIG. 5. In some embodiments, the operations of method 500 are a subset of a method of operating an IC, e.g., a processor, logic, memory, or signal processing circuit, or the like. In some embodiments, the operations of method 500 are a subset of a method of performing a memory array test.

Figures 6A, 6B:
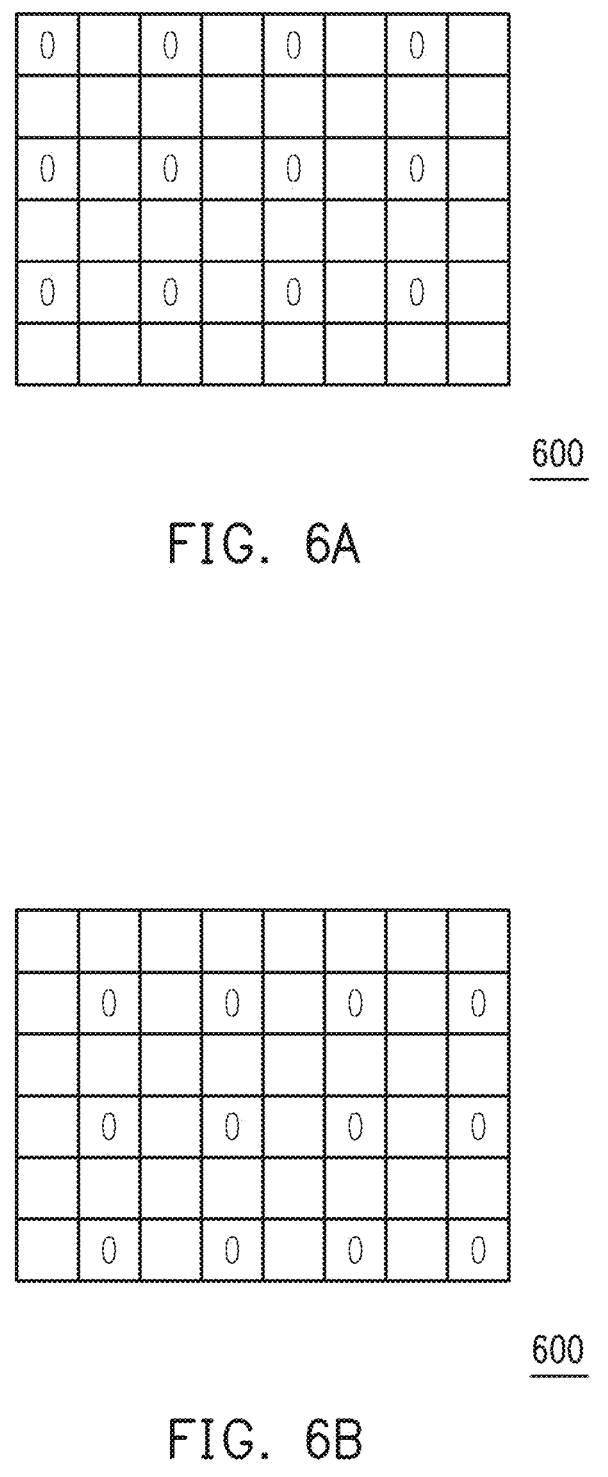
Figures 6C, 6D:
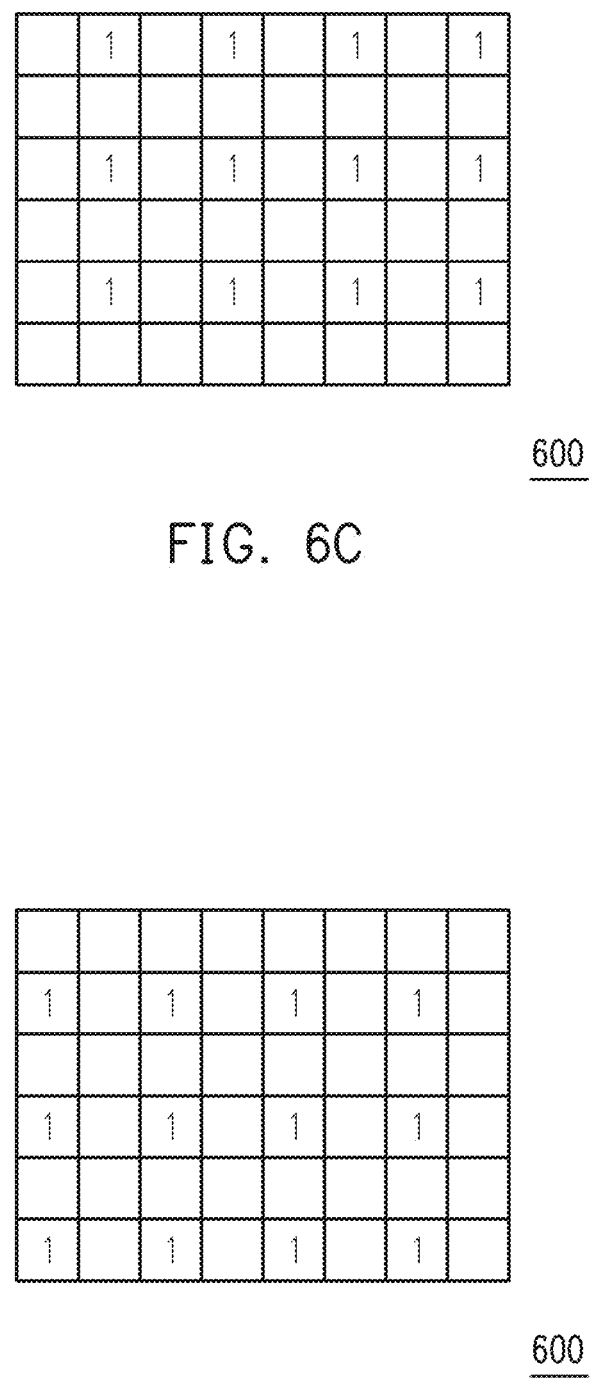
Figure 6E:
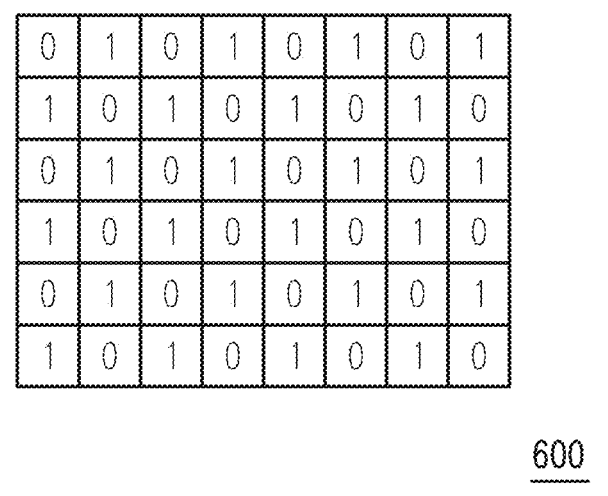
Figures 7A, 7B:
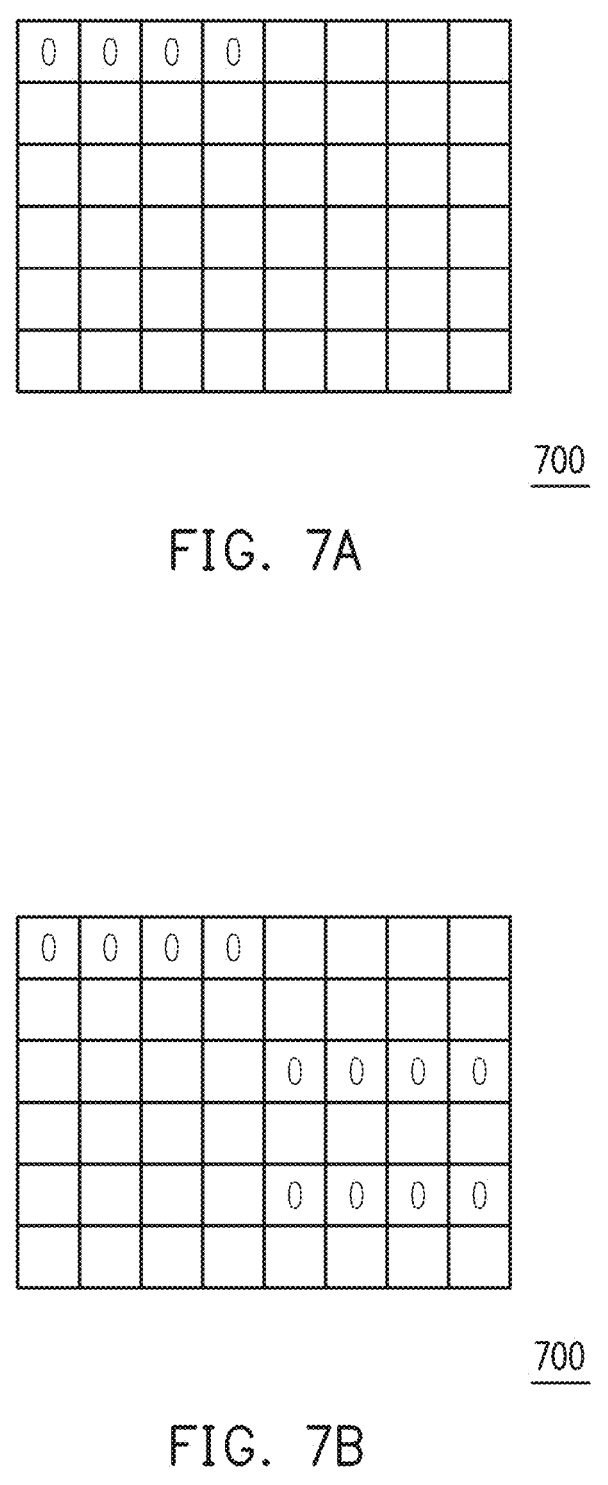
Figures 7C, 7D:
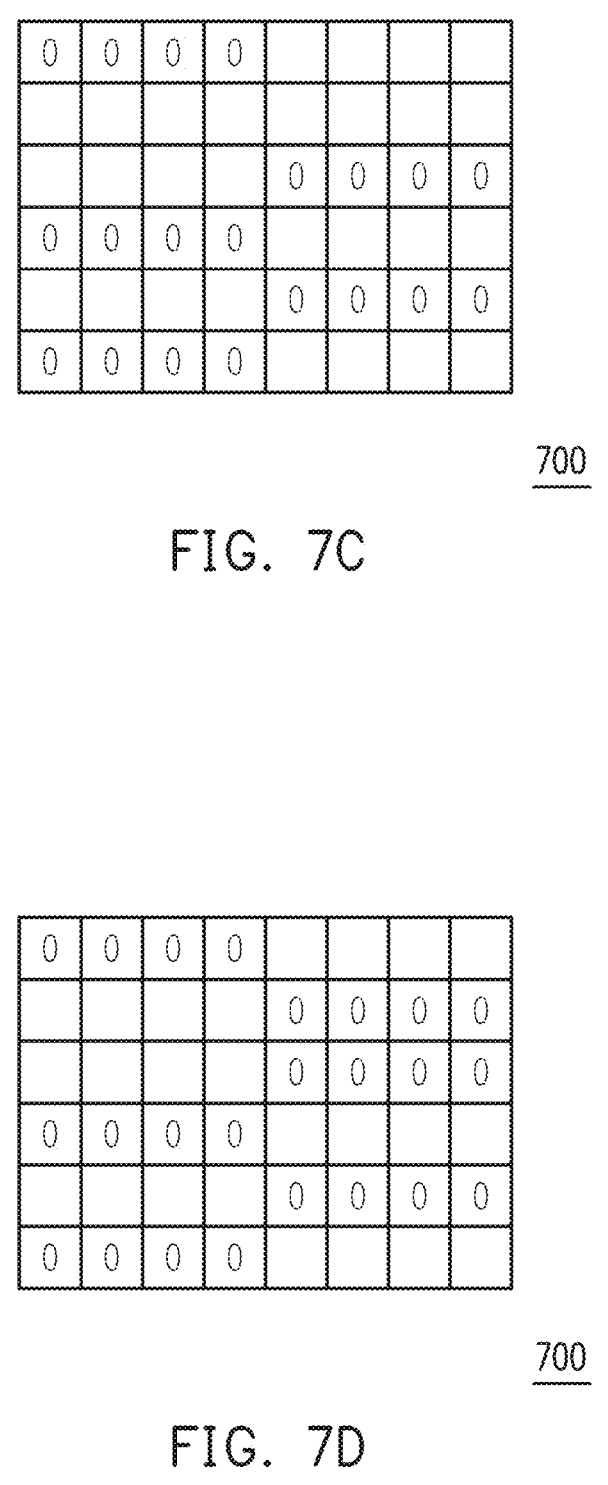
Figures 7E, 7F:
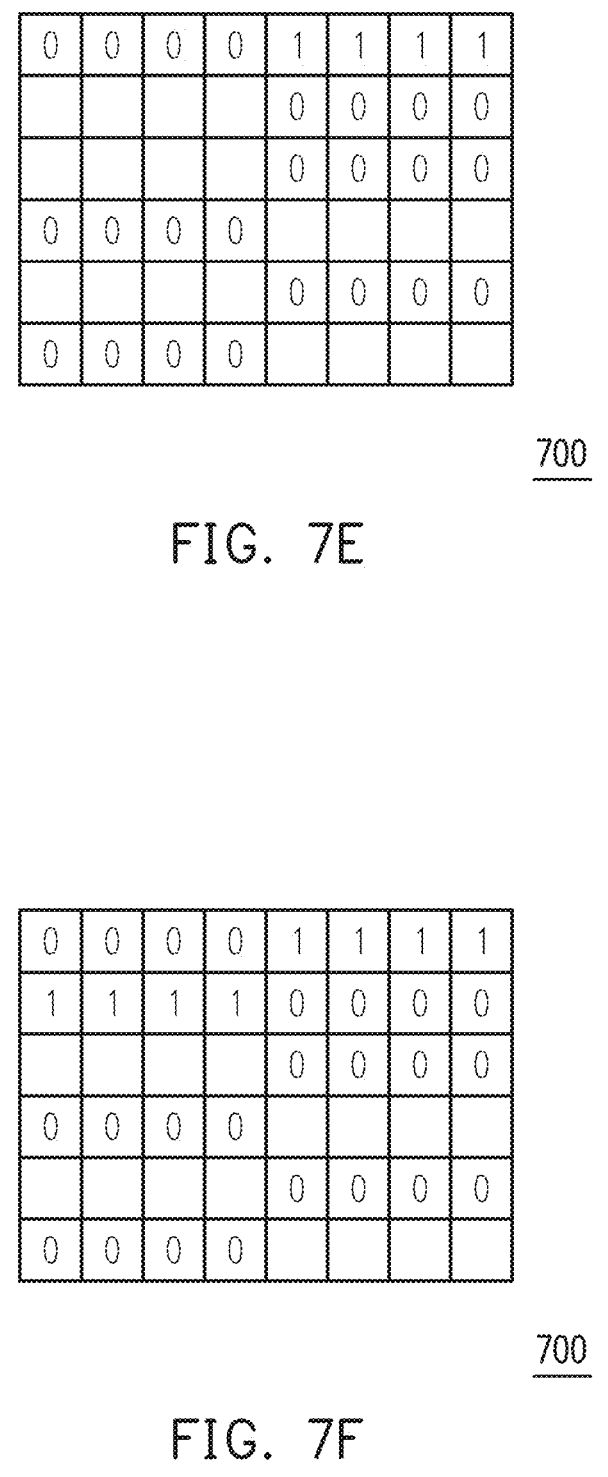
Figures 8A, 8B:
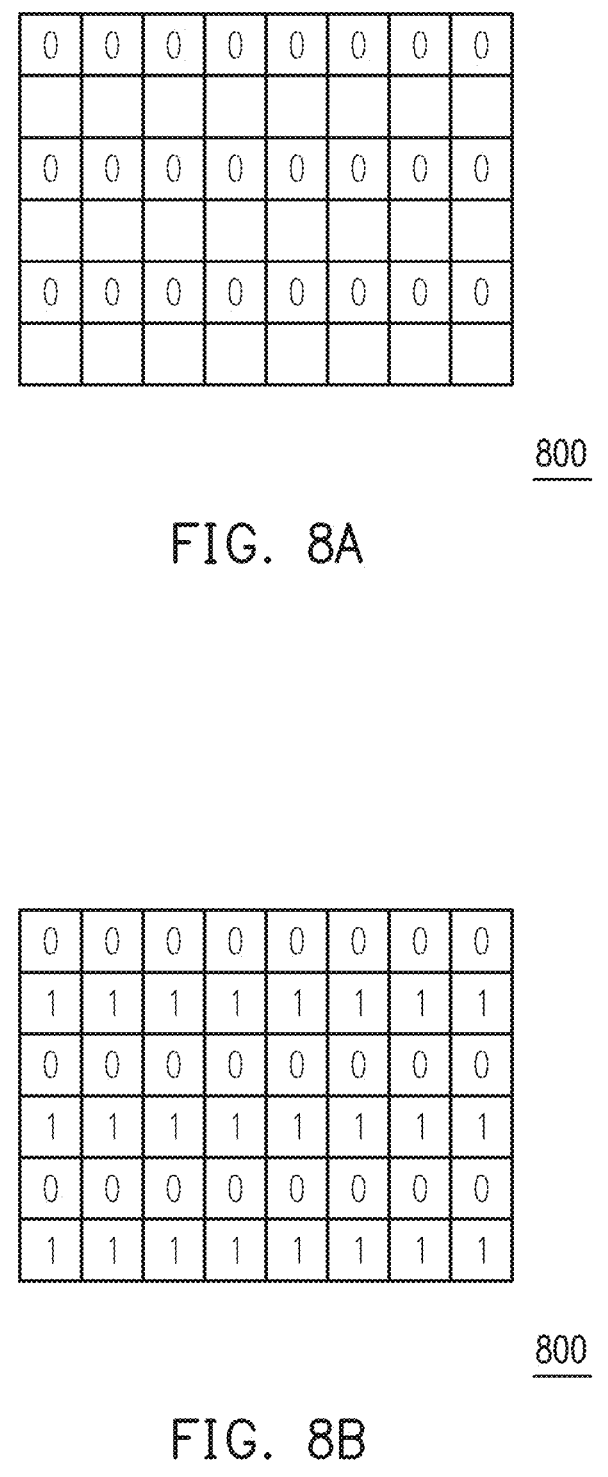

FIGS. 6A-6E are diagrams of a memory array 600, FIGS. 7A-7H are diagrams of a memory array 700, and FIGS. 8A and 8B are diagrams of a memory array 800, in accordance with some embodiments. Each of memory arrays 600, 700, and 800 is usable as memory array 110 discussed above with respect to memory circuit 100 and FIGS. 1A-1F, in an embodiment including eight columns (not labeled) and six rows (not labeled).

FIGS. 6A-6E, 7A-7H, 8A, and 8B depict non-limiting examples corresponding to the operations of method 500 as discussed below. In FIGS. 6A-6E, 7A-7H, 8A, and 8B, the logic high level is represented as a "1" and the logic low level is represented as a "0".

By performing some or all of the operations discussed below, method 500 includes executing an algorithm in which multiple cells in a single column are simultaneously programmed in a write operation based on identifying subsets of memory cells having matching data patterns, and simultaneously programming the identified subsets of memory cells in the programming operation. The matching data patterns are identified by accessing a storage device, e.g., storage medium 144 discussed above with respect to FIGS. 1A-1D, configured to store a plurality of data patterns included in the programming operation.

At operation 505, in some embodiments, the plurality of data patterns is received at the storage device, e.g., storage medium 144 discussed above with respect to FIGS. 1A-1D. In various embodiments, receiving the plurality of data patterns includes receiving the rows and columns of high and low logic levels depicted in one of FIGS. 6E, 7H, or 8B.

At operation 510, in some embodiments, the plurality of data patterns is stored in the storage device. In various embodiments, storing the plurality of data patterns in the storage device includes storing the plurality of data patterns in the storage device included in a memory circuit including the memory array or in a circuit external to the memory circuit including the memory array. In some embodiments, storing the plurality of data patterns in the storage device includes storing the plurality of data patterns in storage medium 144 discussed above with respect to memory circuit 100 and FIGS. 1A-1F.

The plurality of data patterns corresponds to data configured to be written to a portion or all of the memory array in the programming operation. The plurality of data patterns corresponds to an array, e.g., an entirety of the memory array, such that each data pattern of the plurality of data patterns corresponds to one of a column or a row of the array. In various embodiments, the correspondence of each data pattern to the one of a column or a row is predetermined or is determinable as part of retrieving one or more data patterns from the storage device.

The storage device is configured to have access times significantly faster than those included in the programming operation such that accessing the plurality of data patterns does not significantly impact the overall length of the programming operation. In some embodiments, the storage device includes an SRAM or DRAM configuration.

At operation 520, a first data pattern is identified corresponding to a first subset of memory cells arranged in a first line extending in a first array dimension and located at a first position along a second array dimension. Identifying the first data pattern includes identifying a pattern of logic high bits extending in the first line or a pattern of logic low bits extending in the first line.

In some embodiments, the first line corresponds to a first column of memory cells, e.g., extending vertically, the first position corresponds to a first position within a row of memory cells, e.g., extending horizontally, and the first data pattern corresponds to a first subset of memory cells in the first column, e.g., the first subset of memory cells 112 coupled to a first bit line BL0-BL4 of a corresponding column C0-C3 discussed above with respect to FIGS. 1A-1F.

In some embodiments, the first line corresponds to a first row of memory cells, the first position corresponds to a first position within a column of memory cells, and the first data pattern corresponds to a subset of memory cells in a word line of a first plurality of word lines, e.g., odd numbered word lines WL1, WL3, and WL5 or even numbered word lines WL0, WL2, and WL4 coupled to first subsets of memory cells 112 of each of columns C0-C3 discussed above with respect to FIGS. 1A-1F.

In some embodiments, the first line corresponds to the topmost row depicted in FIGS. 6A-6E, and identifying the first data pattern includes identifying the corresponding pattern of low logic levels depicted in FIG. 6A or the corresponding pattern of high logic levels depicted in FIG. 6C. In some embodiments, the first line corresponds to the topmost or third row depicted in FIGS. 7A-7H, and identifying the first data pattern includes identifying the corresponding pattern of low logic levels depicted in FIGS. 7A or 7B. In some embodiments, the first line corresponds to the leftmost column depicted in FIGS. 8A and 8B, and identifying the first data pattern includes identifying the corresponding pattern of low logic levels depicted in FIG. 8A.

In some embodiments, identifying the first data pattern based on the first line corresponding to one of the first column or the first row is based on a predetermined association of the data patterns with either columns or rows. In some embodiments, identifying the first data pattern based on the first line corresponding to one of the first column or the first row includes selecting the column or row correspondence type based on evaluating the plurality of data patterns.

In some embodiments, evaluating the plurality of data patterns includes comparing numbers of programming operations based on each correspondence type. In some embodiments, evaluating the plurality of data patterns includes comparing numbers of columns and rows, e.g., determining that a number of rows of the memory array being programmed in a programming operation is greater than twice the number of columns of the memory array being programmed in the programming operation.

In some embodiments, identifying the first data pattern corresponding to the first subset of memory cells includes accessing the storage device, e.g., storage medium 144 discussed below with respect to FIGS. 1A-1D.

At operation 530, a second subset of memory cells is identified corresponding to the first data pattern, the second subset of memory cells being arranged in a second line extending in the first array dimension and located at a second position along the second array dimension. Identifying the second subset of memory cells corresponding to the first data pattern includes matching a second data pattern to the first data pattern, the second data pattern being associated with the second subset of memory cells.

In some embodiments, the second subset is one subset of a plurality of subsets, and identifying the second subset of memory cells corresponding to the first data pattern includes identifying the plurality of subsets corresponding to the first pattern, each subset of the plurality of subsets extending in the first array dimension and being located at a corresponding position along the second array dimension.

In some embodiments, the second line corresponds to a second column of memory cells, and the second position corresponds to a second position within the row of memory cells. In some embodiments, the second column is one column of a plurality of columns, and identifying the second subset of memory cells corresponding to the first data pattern includes identifying subsets of memory cells of each column of the plurality of columns corresponding to the first data pattern. In some embodiments, identifying the subsets of memory cells of each column of the plurality of columns corresponding to the first data pattern includes identifying an entirety of the subsets of memory cells of each column of the plurality of columns corresponding to the first data pattern included in the programming operation.

In some embodiments, identifying the second subset of memory cells corresponding to the first data pattern includes identifying first subsets of memory cells 112 of columns C0-C3 discussed above with respect to FIGS. 1A-1F.

In some embodiments, the second line corresponds to a second row of memory cells, the second position corresponds to a second position within the column of memory cells, and identifying the second subset of memory cells corresponding to the first data pattern includes the second row being one row of the first plurality of rows. In some embodiments, the second row is one row of the first plurality of rows, and identifying the second subset of memory cells corresponding to the first data pattern includes identifying subsets of memory cells of each row of the first plurality of rows corresponding to the first data pattern. In some embodiments, identifying the subsets of memory cells of each row of the first plurality of rows corresponding to the first data pattern includes identifying an entirety of the subsets of memory cells of each row of the plurality of rows corresponding to the first data pattern included in the programming operation.

In some embodiments, identifying the second subset of memory cells corresponding to the first data pattern includes identifying memory cells 112 of odd numbered rows R1, R3, and R5 or even numbered rows R0, R2, and R4 discussed above with respect to FIGS. 1A-1F.

In some embodiments, identifying the second subset of memory cells corresponding to the first data pattern includes accessing the storage device, e.g., storage medium 144 discussed above with respect to FIGS. 1A-1D.

In some embodiments, identifying the second subset of memory cells corresponding to the first data pattern includes failing to identify a second subset of memory cells corresponding to the first data pattern.

In some embodiments, identifying the second subset of memory cells includes identifying the third and fifth rows depicted in FIGS. 6A or 6C. In some embodiments, identifying the second subset of memory cells includes failing to identify an additional row as depicted in FIG. 7A or identifying the fifth row depicted in FIG. 7B. In some embodiments, identifying the second subset of memory cells includes identifying the second through eighth columns depicted in FIG. 8A

At operation 540, the first and second subsets of memory cells are simultaneously programmed to a first or second logic level. In various embodiments, programming a memory cell, e.g., the first and second subsets of memory cells, to the first or second logic level includes the first logic level being the logic high level and the second logic level being the logic low level, or includes the first logic level being the logic low level and the second logic level being the logic high level.

In some embodiments, the second subset is one subset of the plurality of subsets identified in operation 530, and simultaneously programming the first and second subsets of memory cells to the first logic level includes simultaneously programming the plurality of subsets to the first logic level.

Simultaneously programming the first and second subsets of memory cells includes activating a select line and a first bit line of each column of memory cells included in the first and second subsets of memory cells and activating each word line of the first plurality of word lines.

In some embodiments, simultaneously programming the first and second subsets of memory cells to the first logic level includes executing operations 310 and 320 of method 300 discussed above with respect to FIG. 3.

In some embodiments in which a second subset of memory cells is not identified as corresponding to the first data pattern, simultaneously programming the first and second subsets of memory cells includes programming the first subset of memory cells without programming a second subset of memory cells.

In some embodiments, simultaneously programming the first and second subsets of memory cells includes simultaneously programming the topmost, third, and fifth rows depicted in FIGS. 6A or 6C. In some embodiments, simultaneously programming the first and second subsets of memory cells includes simultaneously programming the topmost row in FIG. 7A or simultaneously programming the third and fifth rows depicted in FIG. 7B. In some embodiments, simultaneously programming the first and second subsets of memory cells includes simultaneously programming the leftmost through eighth columns depicted in FIG. 8A.

At operation 550, in some embodiments, some or all of operations 520-540 are repeated until all memory cells of the memory array being programmed in the programming operation have been programmed to the first or second logic level.

Repeating operation 520 includes one or both of the first data pattern being a first data pattern different from first data patterns previously identified by executing operation 520 or the first subset of memory cells being a first subset of memory cells different from first subsets of memory cells previously identified by executing operation 520. Repeating operations 530 and 540 is thereby based on unique combinations of first data patterns and first subsets of memory cells.

In some embodiments, the first subsets of memory cells correspond to columns, and repeating some or all of operations 520-540 includes executing operations 520-540 based on a first subset of memory cells in each of a first column through a last column, e.g., sequentially by column number. In some embodiments, executing operations 520-540 based on the first subset of memory cells in each of the first column through the last column includes bypassing a given column if all of the memory cells in the given column have previously been programmed.

In some embodiments, the first subsets of memory cells correspond to columns, and repeating some or all of operations 520-540 includes, for a given column, executing operations 520-540 for each of the four combinations of programming memory cells to the logic high and low levels and programming the first and second subsets of memory cells of the given column, e.g., odd and even rows.

In some embodiments, the first subsets of memory cells correspond to rows, and repeating some or all of operations 520-540 includes executing operations 520-540 based on a first subset of memory cells in each of a first row through a last row, e.g., sequentially by row number. In some embodiments, executing operations 520-540 based on the first subset of memory cells in each of the first row through the last row includes bypassing a given row if all of the memory cells in the given row have previously been programmed.

In some embodiments, the first subsets of memory cells correspond to rows, and repeating some or all of operations 520-540 includes, for a given column, executing operations 520-540 for each of the two combinations of programming memory cells to the logic high and low levels.

In some embodiments, repeating some or all of operations 520-540 includes programming memory array 600 by executing each of operations 520-540 based on first subsets of memory cells corresponding to rows, as depicted in FIGS. 6A-6E. FIG. 6A depicts executing operations 520-540 to program a first plurality of subsets of memory cells of a first plurality of rows to the logic low level. FIG. 6B depicts executing operations 520-540 to program a first plurality of subsets of memory cells of a second plurality of rows to the logic low level. FIG. 6C depicts executing operations 520-540 to program a second plurality of subsets of memory cells of the first plurality of rows to the logic high level. FIG. 6D depicts executing operations 520-540 to program a second plurality of subsets of memory cells of the second plurality of rows to the logic high level. FIG. 6E depicts memory array 600 after executing the programming operation by repeating some or all of operations 520-540, thereby matching the plurality of data patterns stored in the storage device, e.g., storage medium 144 discussed above with respect to FIGS. 1A-1D.

In some embodiments, repeating some or all of operations 520-540 includes programming memory array 700 by executing each of operations 520-540 based on first subsets of memory cells corresponding to rows, as depicted in FIGS. 7A-7H. FIG. 7A depicts executing operations 520-540 to program a first subset of memory cells of a first plurality of rows to the logic low level. FIG. 7B depicts executing operations 520-540 to program a first plurality of subsets of memory cells of the first plurality of rows to the logic low level. FIG. 7C depicts executing operations 520-540 to program a first plurality of subsets of memory cells of a second plurality of rows to the logic low level. FIG. 7D depicts executing operations 520-540 to program a second subset of memory cells of the second plurality of rows to the logic low level. FIG. 7E depicts executing operations 520-540 to program a second subset of memory cells of the first plurality of rows to the logic high level. FIG. 7F depicts executing operations 520-540 to program a second subset of memory cells of the second plurality of rows to the logic high level. FIG. 7G depicts executing operations 520-540 to program a second plurality of subsets of memory cells of the first plurality of rows to the logic high level. FIG. 7H depicts executing operations 520-540 to program a second plurality of subsets of memory cells of the second plurality of rows to the logic high level, thereby completing the programming operation on memory array 700 by repeating some or all of operations 520-540 so as to match the plurality of data patterns stored in the storage device, e.g., storage medium 144 discussed above with respect to FIGS. 1A-1D.

In some embodiments, repeating some or all of operations 520-540 includes programming memory array 800 by executing each of operations 520-540 based on first subsets of memory cells corresponding to columns, as depicted in FIGS. 8A and 8B. FIG. 8A depicts executing operations 520-540 to program a first plurality of subsets of memory cells of each column to the logic low level. FIG. 8B depicts executing operations 520-540 to program a second plurality of subsets of memory cells of each column to the logic high level, thereby completing the programming operation on memory array 800 by repeating some or all of operations 520-540 so as to match the plurality of data patterns stored in the storage device, e.g., storage medium 144 discussed above with respect to FIGS. 1A-1D.

In some embodiments, repeating some or all of operations 520-540 is executed, at least partly, using control circuit 140 discussed above with respect to memory circuit 100 and FIGS. 1A-1F.

In some embodiments, the memory array includes a plurality of layers of columns and rows, and repeating some or all of operations 520-540 includes repeating some or all of operations 520-540 on each layer of the plurality of layers included in the programming operation.

By executing some or all of the operations of method 500, an algorithm is executed in which multiple cells in a single column are simultaneously programmed in a write operation, thereby realizing the benefits discussed above with respect to memory circuit 100. By identifying subsets of memory cells having matching data patterns, and simultaneously programming the identified subsets of memory cells in the programming operation, execution of method 500 results in fewer programming operations than approaches in which subsets of memory cells having matching data patterns are not simultaneously programmed, thereby decreasing overall programming time.

In some embodiments, a memory circuit includes a memory array including a first column, the first column including a select line, first and second bit lines, a first subset of memory cells coupled to the select line and the first bit line, and a second subset of memory cells coupled to the select line and the second bit line, and a control circuit configured to simultaneously activate each of the select line and the first bit line, and, during a period in which the select line and first bit line are simultaneously activated, activate a first plurality of word lines, wherein each word line of the first plurality of word lines is coupled to a memory cell of the first subset of memory cells. In some embodiments, the control circuit is configured to, during the period in which the select line and first bit line are simultaneously activated, cause the second bit line to have a reference voltage level. In some embodiments, each word line of a second plurality of word lines is coupled to a memory cell of the second subset of memory cells, and the control circuit is configured to, during the period in which the select line and first bit line are simultaneously activated, cause the second plurality of word lines to have a reference voltage level. In some embodiments, one of the first or second subsets of memory cells are positioned in even numbered rows of memory cells of the memory array, and the other of the first or second subsets of memory cells are positioned in odd numbered rows of memory cells of the memory array. In some embodiments, the control circuit is configured to simultaneously activate each of the select line and the first bit line by driving each of the select line and the first bit line to a S/D voltage level having a first polarity, and activate the first plurality of word lines by driving each word line of the first plurality of word lines to a gate voltage level having a second polarity opposite the first polarity. In some embodiments, the S/D voltage level and the gate voltage level have a same magnitude. In some embodiments, each memory cell of the first and second subsets of memory cells includes an FRAM cell.

In some embodiments, a method of writing data to a memory array includes simultaneously programming a first subset of memory cells in a first column of the memory array to a first logic level by activating a first select line of the first column and a first bit line of the first column, and simultaneously programming a second subset of memory cells in the first column to the first logic level by activating the first select line and a second bit line of the first column, wherein each memory cell of the memory array is a three-terminal memory cell. In some embodiments, the method includes simultaneously programming a third subset of memory cells in the first column to a second logic level by activating the first select line and the first bit line, and simultaneously programming a fourth subset of memory cells in the first column to the second logic level by activating the first select line and the second bit line. In some embodiments, each of the activating the first select line and the first bit line and the activating the first select line and the second bit lines includes driving the first select line and the first or second bit line to a first S/D voltage level having a first polarity when the first or second subset of memory cells is being programmed to the first logic level, and driving the first select line and the first or second bit line to a second S/D voltage level having a second polarity when the third or fourth subset of memory cells is being programmed to the second logic level. In some embodiments, each of the simultaneously programming the first subset of memory cells to the first logic level and the simultaneously programming the second subset of memory cells to the first logic level includes simultaneously driving a corresponding subset of word lines to a first gate voltage level having the second polarity, and each of the simultaneously programming the third subset of memory cells to the second logic level and the simultaneously programming the fourth subset of memory cells to the second logic level includes simultaneously driving a corresponding subset of word lines to a second gate voltage level having the first polarity. In some embodiments, the method includes simultaneously programming a fifth subset of memory cells in a second column of the memory array to the first logic level by activating a second select line of the second column and a third bit line of the second column, simultaneously programming a sixth subset of memory cells in the second column to the first logic level by activating the second select line and a fourth bit line of the second column, simultaneously programming a seventh subset of memory cells in the second column to the second logic level by activating the second select line and the third bit line, and simultaneously programming an eighth subset of memory cells in the second column to the second logic level by activating the second select line and the fourth bit line. In some embodiments, each three-terminal memory cell of the memory array includes an FRAM cell. In some embodiments, the method is part of a programming operation and includes, before simultaneously programming the first subset of memory cells and simultaneously programming the second subset of memory cells, determining that a number of rows of the memory array being programmed in the programming operation is greater than twice a number of columns of the memory array being programmed in the programming operation.

In some embodiments, a method of writing data to a memory array includes identifying a first data pattern corresponding to a first subset of memory cells arranged in a first line extending in a first array dimension and located at a first position along a second array dimension, identifying a second subset of memory cells corresponding to the first data pattern, the second subset of memory cells being arranged in a second line extending in the first array dimension and located at a second position along the second array dimension, and simultaneously programming the first and second subsets of memory cells to a first logic level. In some embodiments, the first and second lines correspond to respective first and second columns of memory cells, each of the first and second positions corresponds to a position within a row of memory cells, and simultaneously programming the first and second subsets of memory cells to the first logic level includes activating a select line and first bit line in each of the first and second columns. In some embodiments, the method includes identifying a second data pattern corresponding to a third subset of memory cells of the memory cells of the first column, identifying a fourth subset of memory cells corresponding to the second data pattern, the fourth subset of memory cells being included in a third column of memory cells located at a third position within the row of memory cells, and simultaneously programming the third and fourth subsets of memory cells to the first logic level, simultaneously programming the third and fourth subsets of memory cells to the first logic level including activating the select line and a second bit line in the first column. In some embodiments, the first and second lines correspond to respective first and second rows of memory cells, each of the first and second positions corresponds to a position within a column of memory cells, and simultaneously programming the first and second subsets of memory cells to the first logic level includes activating a select line and first bit line of the column. In some embodiments, the method includes identifying a second data pattern corresponding to a third subset of memory cells of the memory cells of a third row of memory cells located at a third position within the column, identifying a fourth subset of memory cells corresponding to the second data pattern, the fourth subset of memory cells being included in a fourth row of memory cells located at a fourth position within the column, and simultaneously programming the third and fourth subsets of memory cells to the first logic level, simultaneously programming the third and fourth subsets of memory cells to the first logic level including activating the select line and a second bit line in the column. In some embodiments, each of identifying the first data pattern corresponding to the first subset of memory cells and identifying the second subset of memory cells corresponding to the first data pattern includes accessing a storage device having stored write data including the first data pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
a memory array comprising a first column, the first column comprising:
 a select line;
 first and second bit lines;
 a first subset of memory cells coupled to the select line and the first bit line; and
 a second subset of memory cells coupled to the select line and the second bit line; and
a control circuit configured to:
 simultaneously activate each of the select line and the first bit line, and
 during a period in which the select line and first bit line are simultaneously activated, activate a first plurality of word lines, wherein each word line of the first plurality of word lines is coupled to a memory cell of the first subset of memory cells.

2. The memory circuit of claim 1, wherein
the control circuit is configured to, during the period in which the select line and first bit line are simultaneously activated, cause the second bit line to have a reference voltage level.

3. The memory circuit of claim 1, wherein
each word line of a second plurality of word lines is coupled to a memory cell of the second subset of memory cells, and
the control circuit is configured to, during the period in which the select line and first bit line are simultaneously activated, cause the second plurality of word lines to have a reference voltage level.

4. The memory circuit of claim 1, wherein
one of the first or second subsets of memory cells are positioned in even numbered rows of memory cells of the memory array, and
the other of the first or second subsets of memory cells are positioned in odd numbered rows of memory cells of the memory array.

5. The memory circuit of claim 1, wherein the control circuit is configured to:
simultaneously activate each of the select line and the first bit line by driving each of the select line and the first bit line to a source/drain (S/D) voltage level having a first polarity, and
activate the first plurality of word lines by driving each word line of the first plurality of word lines to a gate voltage level having a second polarity opposite the first polarity.

6. The memory circuit of claim 5, wherein the S/D voltage level and the gate voltage level have a same magnitude.

7. The memory circuit of claim 1, wherein each memory cell of the first and second subsets of memory cells comprises a ferroelectric random-access memory (FRAM) cell.

8. The memory circuit of claim 1, wherein
the first column comprises a third subset of memory cells coupled to the select line and the first bit line,
each word line of a second plurality of word lines is coupled to a memory cell of the third subset of memory cells, and
the control circuit is configured to, during the period in which the select line and first bit line are simultaneously activated, cause each word line of the second plurality of word lines to have a reference voltage level.

9. The memory circuit of claim 1, further comprising:
a non-transitory, computer-readable storage medium,
wherein the control circuit is configured to identify the first subset of memory cells based on a data pattern stored in the non-transitory, computer-readable storage medium.

10. The memory circuit of claim 1, wherein
the memory array comprises a second column, the second column comprising:
 another select line;
 a third bit line; and
 a third subset of memory cells coupled to the another select line, the third bit line, and the first plurality of word lines, and
the control circuit is configured to, during the period in which the select line and first bit line are simultaneously activated, activate the another select line and the third bit line.

11. The memory circuit of claim 10, wherein the second column comprises the second bit line.

12. A memory circuit comprising:
a memory array comprising:
 first and second pluralities of word lines; and
 a first column comprising:
  a select line;
  first and second bit lines;
  a first subset of memory cells coupled to the select line, the first bit line, and the first plurality of word lines; and
  a second subset of memory cells coupled to the select line, the second bit line, and the second plurality of word lines; and
a control circuit configured to simultaneously:
 activate each of the select line, the first bit line, and each word line of the first plurality of word lines, and
 cause the second bit line and each word line of the second plurality of word lines to have a reference voltage level.

13. The memory circuit of claim 12, wherein
the word lines of one of the first or second pluralities of word lines are positioned in even numbered rows of memory cells of the memory array, and
the word lines of the other of the first or second pluralities of word lines are positioned in odd numbered rows of memory cells of the memory array.

14. The memory circuit of claim 12, wherein
the first column is a first column of a plurality of columns of the memory array,
each column of the plurality of columns comprises a corresponding select line, first and second bit lines, first subset of memory cells coupled to the select line, the first bit line, and the first plurality of word lines, and second subset of memory cells coupled to the select line, the second bit line, and the second plurality of word lines, and
the control circuit is configured to simultaneously activate the select line and first bit line of each column of the plurality of columns, and cause the second bit line of each column of the plurality of columns to have the reference voltage level.

15. The memory circuit of claim 14, wherein
each column of the plurality of columns comprises a third subset of memory cells coupled to the select line, the first bit line, and a third plurality of word lines, and
the control circuit is configured to, during the period in which the select line and first bit line of each column of the plurality of columns and each word line of the first plurality of word lines are simultaneously activated, cause each word line of the third plurality of word lines to have the reference voltage level.

16. The memory circuit of claim 15, wherein
the plurality of columns is a first plurality of columns of the memory array,
the memory array comprises a second plurality of columns, each column of the second plurality of columns comprising a corresponding select line and a corresponding plurality of memory cells coupled to the select line and the first, second, and third pluralities of word lines, and
the control circuit is configured to, during the period in which the select line and first bit line of each column of the first plurality of columns and each word line of the first plurality of word lines are simultaneously activated, cause the select line of each column of the second plurality of columns to have the reference voltage level.

17. The memory circuit of claim 12, further comprising:
a non-transitory, computer-readable storage medium,
wherein the control circuit is configured to identify the first plurality of word lines based on a data pattern stored in the non-transitory, computer-readable storage medium.

18. A memory circuit comprising:
a memory array comprising:
first and second pluralities of word lines; and
first and second columns, each of the first and second columns comprising:
a select line;
first and second bit lines;
a first subset of ferroelectric random-access memory (FRAM) cells coupled to the first select line, the first bit line, and the first plurality of word lines; and
a second subset of FRAM cells coupled to the first select line, the second bit line, and the second plurality of word lines; and
a control circuit configured to simultaneously:
drive each word line of the first plurality of word lines to a gate voltage level having a first polarity,
drive the select line and first bit line of each of the first and second columns to a source/drain (S/D) voltage level having a second polarity opposite the first polarity, and
cause each word line of the second plurality of word lines and the second bit line of each of the first and second columns to have a reference voltage level.

19. The memory circuit of claim 18, wherein the control circuit is configured to simultaneously:
drive each word line of the first plurality of word lines to the gate voltage level having the second polarity,
drive the select line and first bit line of each of the first and second columns to the S/D voltage level having the first polarity, and
cause each word line of the second plurality of word lines and the second bit line of each of the first and second columns to have the reference voltage level.

20. The memory circuit of claim 18, further comprising:
a non-transitory, computer-readable storage medium,
wherein the control circuit is configured to perform a memory array test comprising identifying the first and second columns based on a data pattern stored in the non-transitory, computer-readable storage medium.

* * * * *